United States Patent
Shimura

(10) Patent No.: US 10,847,988 B2
(45) Date of Patent: Nov. 24, 2020

(54) SECONDARY BATTERY CHARGING APPARATUS, TEMPERATURE INFORMATION ACQUISITION DEVICE, SECONDARY BATTERY CHARGING METHOD, IN-SITU MEASUREMENT METHOD OF ELECTROCHEMICAL IMPEDANCE SPECTRUM

(71) Applicant: MURATA MANUFACTURING CO., LTD., Kyoto (JP)

(72) Inventor: Jusuke Shimura, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 137 days.

(21) Appl. No.: 16/133,093

(22) Filed: Sep. 17, 2018

(65) Prior Publication Data

US 2019/0036373 A1  Jan. 31, 2019

Related U.S. Application Data

(63) Continuation of application No. PCT/JP2017/001576, filed on Jan. 18, 2017.

(30) Foreign Application Priority Data

Mar. 18, 2016 (JP) .................. 2016-054832

(51) Int. Cl.
| | |
|---|---|
| H02J 7/04 | (2006.01) |
| H02J 7/00 | (2006.01) |
| G01R 31/389 | (2019.01) |
| H01M 10/48 | (2006.01) |
| H01M 10/04 | (2006.01) |

(Continued)

(52) U.S. Cl.
CPC ...... H02J 7/007192 (2020.01); G01R 31/389 (2019.01); H01M 10/0431 (2013.01);

(Continued)

(58) Field of Classification Search
CPC ..... H02J 7/0091; Y02E 60/12; H01M 10/486; H01M 10/5004; Y02T 10/7005
See application file for complete search history.

(56) References Cited

U.S. PATENT DOCUMENTS 5,606,242 A * 2/1997 Hull ...................... H02J 7/0091
320/106
2008/0125932 A1  5/2008 Yamabe et al.
(Continued)

FOREIGN PATENT DOCUMENTS

JP  H11-162526 A  6/1999
JP  2007-311065 A  11/2007
(Continued)

OTHER PUBLICATIONS

International Search Report and Written Opinion issued in connection with International Patent Application No. PCT/JP2017/001576, dated Apr. 11, 2017. (12 pages).

(Continued)

*Primary Examiner* — Arun C Williams
(74) *Attorney, Agent, or Firm* — K&L Gates LLP

(57) ABSTRACT

A secondary battery charging apparatus includes: a charge control device configured to control charge current for charging a secondary battery; and a temperature information acquisition device configured to acquire an internal temperature of the secondary battery, the temperature information acquisition device collects charge current data and charge voltage data in time series and acquires the internal temperature of the secondary battery based on the collected charge current data and charge voltage data when the secondary battery is charging, and the charge control device is configured to charge the secondary battery and control the charge current to set the internal temperature of the secondary battery within a predetermined temperature range.

10 Claims, 18 Drawing Sheets

(51) Int. Cl.
  *H01M 10/0525* (2010.01)
  *H01M 10/44* (2006.01)
  *G01R 31/374* (2019.01)
  *H01M 10/0587* (2010.01)
  *G01R 31/3842* (2019.01)

(52) U.S. Cl.
  CPC ..... *H01M 10/0525* (2013.01); *H01M 10/443* (2013.01); *H01M 10/48* (2013.01); *H01M 10/486* (2013.01); *G01R 31/374* (2019.01); *G01R 31/3842* (2019.01); *H01M 10/0587* (2013.01)

(56) References Cited

U.S. PATENT DOCUMENTS

2009/0110985 A1\* 4/2009 Manabe ............ H01M 8/04089
  429/492

2009/0130538 A1\* 5/2009 Kaita ...................... B60L 58/18
  429/50

FOREIGN PATENT DOCUMENTS

| | | |
|---|---|---|
| JP | 2008-135310 A | 6/2008 |
| JP | 2009-261174 A | 11/2009 |
| JP | 2011-229317 A | 11/2011 |
| JP | 2013-168254 A | 8/2013 |
| JP | 2015-135277 A | 7/2015 |
| WO | 2011/132446 A1 | 10/2011 |
| WO | 2014/073208 A1 | 5/2014 |

OTHER PUBLICATIONS

Japanese Office Action dated Dec. 4, 2018 in corresponding Japanese Application No. 2018-505290.

\* cited by examiner

FIG. 5

| n | DEGREE | | | | | | | |
|---|---|---|---|---|---|---|---|---|
|   | 1 | 2 | 3 | 4 | 5 | 6 | 7 | 8 |
| 0 | 327670 | 327660 | 327640 | 327600 | 327520 | 327360 | 327040 | 326400 |
| 1 | 327671 | 327662 | 327644 | 327608 | 327536 | 327392 | 327104 | 326528 |
| 2 | 327672 | 327664 | 327648 | 327616 | 327552 | 327424 | 327168 | 326656 |
| 3 | 327673 | 327666 | 327652 | 327624 | 327568 | 327456 | 327232 | 326784 |
| 4 | 327674 | 327668 | 327656 | 327632 | 327584 | 327488 | 327296 | 326912 |
| 5 | 327675 | 327670 | 327660 | 327640 | 327600 | 327520 | 327360 | 327040 |
| 6 | 327676 | 327672 | 327664 | 327648 | 327616 | 327552 | 327424 | 327168 |
| 7 | 327677 | 327674 | 327668 | 327656 | 327632 | 327584 | 327488 | 327296 |
| 8 | 327678 | 327676 | 327672 | 327664 | 327648 | 327616 | 327552 | 327424 |
| 9 | 327679 | 327678 | 327676 | 327672 | 327664 | 327648 | 327616 | 327552 |
| 10 | 327680 | 327680 | 327680 | 327680 | 327680 | 327680 | 327680 | 327680 |
| 11 | 327681 | 327682 | 327684 | 327688 | 327696 | 327712 | 327744 | 327808 |
| 12 | 327682 | 327684 | 327688 | 327696 | 327712 | 327744 | 327808 | 327936 |
| 13 | 327683 | 327686 | 327692 | 327704 | 327728 | 327776 | 327872 | 328064 |
| 14 | 327684 | 327688 | 327696 | 327712 | 327744 | 327808 | 327936 | 328192 |
| 15 | 327685 | 327690 | 327700 | 327720 | 327760 | 327840 | 328000 | 328320 |
| 16 | 327686 | 327692 | 327704 | 327728 | 327776 | 327872 | 328064 | 328448 |
| 17 | 327687 | 327694 | 327708 | 327736 | 327792 | 327904 | 328128 | 328576 |
| 18 | 327688 | 327696 | 327712 | 327744 | 327808 | 327936 | 328192 | 328704 |
| 19 | 327689 | 327698 | 327716 | 327752 | 327824 | 327968 | 328256 | 328832 |
| 20 | 327690 | 327700 | 327720 | 327760 | 327840 | 328000 | 328320 | 328960 |

| n | DEGREE | | | | | | | |
|---|---|---|---|---|---|---|---|---|
|   | 9 | 10 | 11 | 12 | 13 | 14 | 15 | 16 |
| 0 | 325120 | 322560 | 317440 | 307200 | 286720 | 245760 | 163840 | 0 |
| 1 | 325376 | 323072 | 318464 | 309248 | 290816 | 253952 | 180224 | 32768 |
| 2 | 325632 | 323584 | 319488 | 311296 | 294912 | 262144 | 196608 | 65536 |
| 3 | 325888 | 324096 | 320512 | 313344 | 299008 | 270336 | 212992 | 98304 |
| 4 | 326144 | 324608 | 321536 | 315392 | 303104 | 278528 | 229376 | 131072 |
| 5 | 326400 | 325120 | 322560 | 317440 | 307200 | 286720 | 245760 | 163840 |
| 6 | 326656 | 325632 | 323584 | 319488 | 311296 | 294912 | 262144 | 196608 |
| 7 | 326912 | 326144 | 324608 | 321536 | 315392 | 303104 | 278528 | 229376 |
| 8 | 327168 | 326656 | 325632 | 323584 | 319488 | 311296 | 294912 | 262144 |
| 9 | 327424 | 327168 | 326656 | 325632 | 323584 | 319488 | 311296 | 294912 |
| 10 | 327680 | 327680 | 327680 | 327680 | 327680 | 327680 | 327680 | 327680 |
| 11 | 327936 | 328192 | 328704 | 329728 | 331776 | 335872 | 344064 | 360448 |
| 12 | 328192 | 328704 | 329728 | 331776 | 335872 | 344064 | 360448 | 393216 |
| 13 | 328448 | 329216 | 330752 | 333824 | 339968 | 352256 | 376832 | 425984 |
| 14 | 328704 | 329728 | 331776 | 335872 | 344064 | 360448 | 393216 | 458752 |
| 15 | 328960 | 330240 | 332800 | 337920 | 348160 | 368640 | 409600 | 491520 |
| 16 | 329216 | 330752 | 333824 | 339968 | 352256 | 376832 | 425984 | 524288 |
| 17 | 329472 | 331264 | 334848 | 342016 | 356352 | 385024 | 442368 | 557056 |
| 18 | 329728 | 331776 | 335872 | 344064 | 360448 | 393216 | 458752 | 589824 |
| 19 | 329984 | 332288 | 336896 | 346112 | 364544 | 401408 | 475136 | 622592 |
| 20 | 330240 | 332800 | 337920 | 348160 | 368640 | 409600 | 491520 | 655360 |

| 2N+1 | REAL PART OF ψ | IMAGINARY PART OF ψ |
|---|---|---|
| 1 | 0 | -71/11558 |
| 2 | 132/11558 | -132/11558 |
| 3 | 444/11558 | 0 |
| 4 | 674/11558 | 674/11558 |
| 5 | 0 | 1848/11558 |
| 6 | -2288/11558 | 2288/11558 |
| 7 | -5117/11558 | 0 |
| 8 | -5168/11558 | -5168/11558 |
| 9 | 0 | -9428/11558 |
| 10 | 7767/11558 | -7767/11558 |
| 11 | 11558/11558 | 0 |
| 12 | 7767/11558 | 7767/11558 |
| 13 | 0 | 9428/11558 |
| 14 | -5168/11558 | 5168/11558 |
| 15 | -5117/11558 | 0 |
| 16 | -2288/11558 | -2288/11558 |
| 17 | 0 | -1848/11558 |
| 18 | 674/11558 | -674/11558 |
| 19 | 444/11558 | 0 |
| 20 | 132/11558 | 132/11558 |
| 21 | 0 | 71/11558 |

SECONDARY BATTERY CHARGING APPARATUS, TEMPERATURE INFORMATION ACQUISITION DEVICE, SECONDARY BATTERY CHARGING METHOD, IN-SITU MEASUREMENT METHOD OF ELECTROCHEMICAL IMPEDANCE SPECTRUM

CROSS REFERENCE TO RELATED APPLICATIONS

The present application is a continuation of PCT patent application no. PCT/JP2017/001576, filed on Jan. 18, 2017, which claims priority to Japanese patent application no. JP2016-054832 filed on Mar. 18, 2016, the entire contents of which are being incorporated herein by reference.

BACKGROUND

The present disclosure generally relates to a secondary battery charging apparatus, a temperature information acquisition device, a secondary battery charging method, and an in-situ measurement method of an electrochemical impedance spectrum.

In recent years, smartphones have been rapidly widespread. As compared to a conventional cell phone, the smartphone has a high-performance processor and a large display screen, and performs many functions such as Wi-Fi (registered trademark) and Bluetooth (registered trademark) communications, with significant increase in power consumption. In line with this, a secondary battery loaded in the smartphone has become increased in capacity. However, it is difficult to use a large-sized secondary battery corresponding to the increase of power consumption, in consideration of the balance with merchantable characteristics such as slimness and lightweight. As a result, the smartphone users are forced into chronic battery capacity shortage. As one of methods for overthrowing such a situation, a fast charge technique has been receiving attention. If short-time battery charging becomes possible, the user can charge quickly the secondary battery in his/her smartphone before going out or can recharge it while on the go. This could compensate for inconvenience of such a relatively small secondary battery.

The most serious cause for making difficult the fast charging of a secondary battery is deterioration. Specifically, flowing a large current for fast charging would cause the second secondary to become rapidly deteriorated and shortened in useful life. There are several modes of deterioration due to fast charging, and which of the modes to be a main cause is decided on a case-by-case basis. Among them, a typical deterioration mode involves temperature. Specifically, when a large current is flown into the secondary battery for fast charging, large Joule heat is generated in the secondary battery to increase the reaction rate of side reaction as a cause of deterioration (for example, capsular formation and gas generation on the surface of an active material).

SUMMARY

The present disclosure generally relates to a secondary battery charging apparatus, a temperature information acquisition device, a secondary battery charging method, and an in-situ measurement method of an electrochemical impedance spectrum.

The lithium-ion secondary batteries, due to conventional charging and discharging methods, were found to be deteriorated significantly on the surface of the negative-electrode member. This is possibly because the internal temperatures of the lithium-ion secondary batteries were not measured accurately but were charged under inappropriate conditions.

A lithium-ion secondary battery is made from a highly thermal conductive material as a current collector like copper foil or aluminum foil. In addition, in a lithium-ion secondary battery, a highly thermal conductive carbon material is frequently used for a conductive aid constituting a positive-electrode member and for a negative-electrode active material constituting a negative-electrode member. It is considered that there is no large difference between the internal temperature of the secondary battery and the surface temperature of the secondary battery. However, the inventor of the present invention produced a half-cell without a negative electrode of a lithium-ion secondary battery and observed in-situ the temperature distribution of the cross section of the current collector by a microscopic thermo viewer. The observation revealed that the contact between the current collector and the active material was in an adiabatic state in a broad view, rather than a diabatic state. This suggested that even the inside of the full cell of the secondary battery was adiabatic and there was a difference between the internal temperature and the surface temperature of the secondary battery.

FIG. 16B shows a photograph of internal temperature distribution obtained by observing an electrode with an active material layer of carbon (hereinafter, called "working electrode") and a half-cell for testing formed from a lithium electrode as a counter electrode in a 7C charging and discharging cycle by a microscopic thermo viewer. It is seen from the photograph that major temperature changes were caused on the top of the carbon layer (indicated with the symbol "A" in FIG. 16B) due to enthalpy changes of lithiation and delithiation, while minor temperature changes were caused on the bottom of the carbon layer (indicated with the symbol "C" in FIG. 16B). The temperature change has two components. One is a component of "Joule heat" with temperature change at both charging and discharging (that is, a gradient component of a base line). The other is a component of "enthalpy" causing alternative heat absorption and heat emission between charging and discharging.

FIG. 16A illustrates average temperature transition and potential changes in each internal region of the secondary battery in a charging and discharging cycle. In the drawing, the symbol "B" represents a region between the top "A" of the carbon layer and the bottom "C" of the carbon layer, "D" represents a counter electrode lithium, "E" represents a working electrode current collector, and "F" represents a counter electrode current collector. The temperature changes in each region (indicated by the gradient of the base line) are as shown in Table 1 below. In Table 1, temperature increase is indicated with the symbol "+" and temperature decrease is indicated with the symbol "−".

TABLE 1

| Region | |
|---|---|
| A | +1.2° C./minute |
| B | +2.0° C./minute |
| C | +2.7° C./minute |
| D | −0.38° C./minute |
| E | +1.3° C./minute |
| F | +1.6° C./minute |

As the result of the measurement of the internal temperature of the half-cell, it has been revealed that the regions of the carbon layer closer to the working electrode current collector were intensely heated and the temperature increase in the entire carbon layer was larger than the temperature increases in the other members. That is, the generated Joule heat tended to be accumulated in the carbon layer. Further, when battery charging was started, the temperature dropped in the order of the region A, the region B, and the region C as illustrated on the left side of FIG. 17. After completion of the charging, the half-cell was left to stand for seven minutes or more but the temperatures hardly changed in the region A, the region B, and the region C. That is, the carbon layer was in contact with the current collector formed from copper or the like but had highly heat-insulating properties. Further, when battery discharging was started, the temperature rose in the order of the region A, the region B, and the region C as illustrated on the right side of FIG. 17. That is, the temperature change was reversible between the charging process and the discharging process.

The microscopic thermo viewer observation, that is, the in-situ observation of temperature change in the negative-electrode member due to lithiation and de-lithiation was conducted by the thermo viewer InfReC H8000 produced by Nippon Avionics Co., Ltd. As a test lithium-ion secondary battery, a cross-section observation cell was used. As a window material in the cell, sapphire glass was used for high transparency in the observation wavelength range of the thermo viewer and capability of visible light observation. Three-electrode electrochemical measurement was made by using the potentiostat ALS 802C produced by BASF. Two-electrode electrochemical measurement was made by using GS610 produced by Yokogawa Electric Corp. The negative pole member used for testing was prepared by mixing black lead and PVdF #9100, NMP=90/10/100 (mass ratio) produced by Wako Pure Chemical Corp. by a homogenizer, applying the mixture with a thickness of 450 μm on 50-μm copper foil by using a Baker applicator, drying at 90° C., and pressing by a hand press such that the volume density of the black lead and PVdf is 1.51 to adjust the thickness. As a separator material, the glass filter paper ADVANTEC GA-55 was used. As an electrolyte, EC/DMC=1/1 (volume ratio) including $LiPF_6$ was used. The concentration of $LiPF_6$ was set to 1 $mol/dm^3$.

Therefore, an object of the present disclosure is to provide a secondary battery charging apparatus that charges a secondary battery based on the accurately acquired internal temperature of the secondary battery, a charging method of a secondary battery, a temperature information acquisition device capable of accurately acquiring the internal temperature of the secondary battery, and an in-situ measurement method of an electrochemical impedance spectrum for accurately acquiring the internal temperature of the secondary battery with the small number of data.

According to an embodiment of the present disclosure, a secondary battery charging apparatus is provided. The secondary battery charging apparatus includes: a charge control device configured to control charge current for charging a secondary battery; and a temperature information acquisition device configured to acquire an internal temperature of the secondary battery. The temperature information acquisition device collects charge current data and charge voltage data in time series and acquires the internal temperature of the secondary battery based on the collected charge current data and charge voltage data when the secondary battery is charging. The charge control device is configured to charge the secondary battery and control the charge current for charging the secondary battery to set the internal temperature of the secondary battery within a predetermined temperature range.

According to another embodiment of the present technology, a secondary battery charging apparatus is provided. The secondary battery charging apparatus includes: a charge control device configured to control charge current for charging a secondary battery having a first lead portion, a second lead portion, an electrolyte and a wound electrode structure including a positive-electrode member, a negative-electrode member, and a separator; and a temperature information acquisition device configured to acquire an internal temperature of the secondary battery. The temperature information acquisition device determines an internal resistance value of the secondary battery from an alternating-current impedance measurement value determined by flowing alternating current between the first lead portion and the second lead portion and acquires the internal temperature of the secondary battery from the internal resistance value when the secondary battery is charging. The charge control device is configured to charge the secondary battery and control the charge current for charging the secondary battery to set the internal temperature of the secondary battery within a predetermined temperature range.

According to another embodiment of the present technology, a temperature information acquisition device is provided. The temperature information acquisition device including a processor configured to acquire an internal temperature of a secondary battery. The temperature information acquisition device collects charge current data and charge voltage data in time series and acquires the internal temperature of the secondary battery based on the collected charge current data and charge voltage data when the secondary battery is charging.

According to another embodiment of the present technology, a temperature information acquisition device is provided. The temperature information acquisition device including a processor configured to acquire an internal temperature of a secondary battery having a first lead portion, a second lead portion, an electrolyte and a wound electrode structure including a positive-electrode member, a negative-electrode member, and a separator. The temperature information acquisition device determines an internal resistance value of the secondary battery from an alternating-current impedance measurement value determined by flowing alternating current between the first lead portion and the second lead portion and acquires the internal temperature of the secondary battery from the internal resistance value when the secondary battery is charging.

According to another embodiment of the present technology, a charging method of a secondary battery is provided. The charging method includes: collecting charge current data and charge voltage data in time series when the secondary battery is charging; acquiring an internal temperature of the secondary battery based on the collected of charge current data and charge voltage data; and charging the secondary battery while controlling charge current to set the acquired internal temperature of the secondary battery within a predetermined temperature range.

According to another embodiment of the present technology, a charging method of a secondary battery is provided. The charging method is a charging method of a secondary battery having a first lead portion, a second lead portion, an electrolyte and a wound electrode structure including a positive-electrode member, a negative-electrode member, and a separator. The charging method includes: determining an internal resistance value of the secondary battery from an alternating-current impedance measurement value determined by flowing alternating current between the first lead portion and the second lead portion; acquiring the internal temperature of the secondary battery from the internal resistance value when the secondary battery is charging; and charging the secondary battery while controlling charge current for charging the secondary battery to set the acquired internal temperature of the secondary battery within a predetermined temperature range.

An in-situ measurement method of an electrochemical impedance spectrum according to another embodiment of the present disclosure includes: during the charging of a secondary battery, collecting M data sets in first to M-th degrees each of which includes (2N+1) charge current data consecutive in time series and (2N+1) charge voltage data consecutive in time series, where N is a positive integer; and acquiring an electrochemical impedance spectrum of the secondary battery based on the M data sets. In the method, (2N+1) charge current data and (2N+1) charge voltage data in an m-th degree, where m=1, 2, 3, . . . M, are determined at a p-th unit time $t_p$ represented by Equation (A) below, where a time of length $T/(M \times 2^M)$ obtained by dividing a predetermined time T into $(N \times 2^M)$ is a unit time t:

$$p = N \times 2^{M-1} + (-N+n) \times 2^{m-1} \quad \text{(A)}$$

where n=0, 1, 2 . . . 2N.

In the secondary battery charging apparatus according to the embodiments of the present disclosure, the temperature information acquisition device according to the embodiments of the present disclosure, and the charging method of a secondary battery according to the embodiments of the present disclosure, during the charging of the secondary battery, the charge current data and charge voltage data are collected in time series, and the internal temperature of the secondary battery is acquired based on the collected plural pieces of charge current data and charge voltage data. This makes it possible to acquire the accurate internal temperature of the secondary battery. In the secondary battery charging apparatus according to the embodiments of the present disclosure, the temperature information acquisition device according to the embodiments of the present disclosure, and the charging method of a secondary battery according to the embodiments of the present disclosure, during the charging of the secondary battery, the internal resistance value of the secondary battery is determined from the alternating-current impedance measurement value determined by flowing alternating current between the first lead portion and the second lead portion, and the internal temperature of the secondary battery is acquired from the internal resistance value. This makes it possible to acquire the accurate internal temperature of the secondary battery.

As a result, it is possible to charge the secondary battery under optimum conditions, suppress the occurrence of the deterioration mode involved in temperature as the greatest cause of making difficult fast charging of the secondary battery, and provide the secondary battery with long-term reliability and excellent long-term charging and discharging cycle characteristics.

According to the in-situ measurement method of an electrochemical impedance spectrum of the present disclosure, the charge current data and the charge voltage data are determined only at the unit time $t_p$ represented by Equation (A). This decreases the numbers of charge current data and charge voltage data to be acquired to the minimum. Accordingly, it is possible to shorten the time for data processing, reduce the load on the temperature information acquisition device, and acquire the accurate internal temperature of the secondary battery.

The advantageous effects described herein are mere examples and are not necessarily limited, and other suitable properties relating to the present technology may be realized and as further described.

BRIEF DESCRIPTION OF THE FIGURES

FIG. 5 is a diagram indicating values of "p" in m-th degrees in an in-situ measurement method of an electrochemical impedance spectrum in the first example according to an embodiment of the present disclosure.

DETAILED DESCRIPTION

Figure 1:
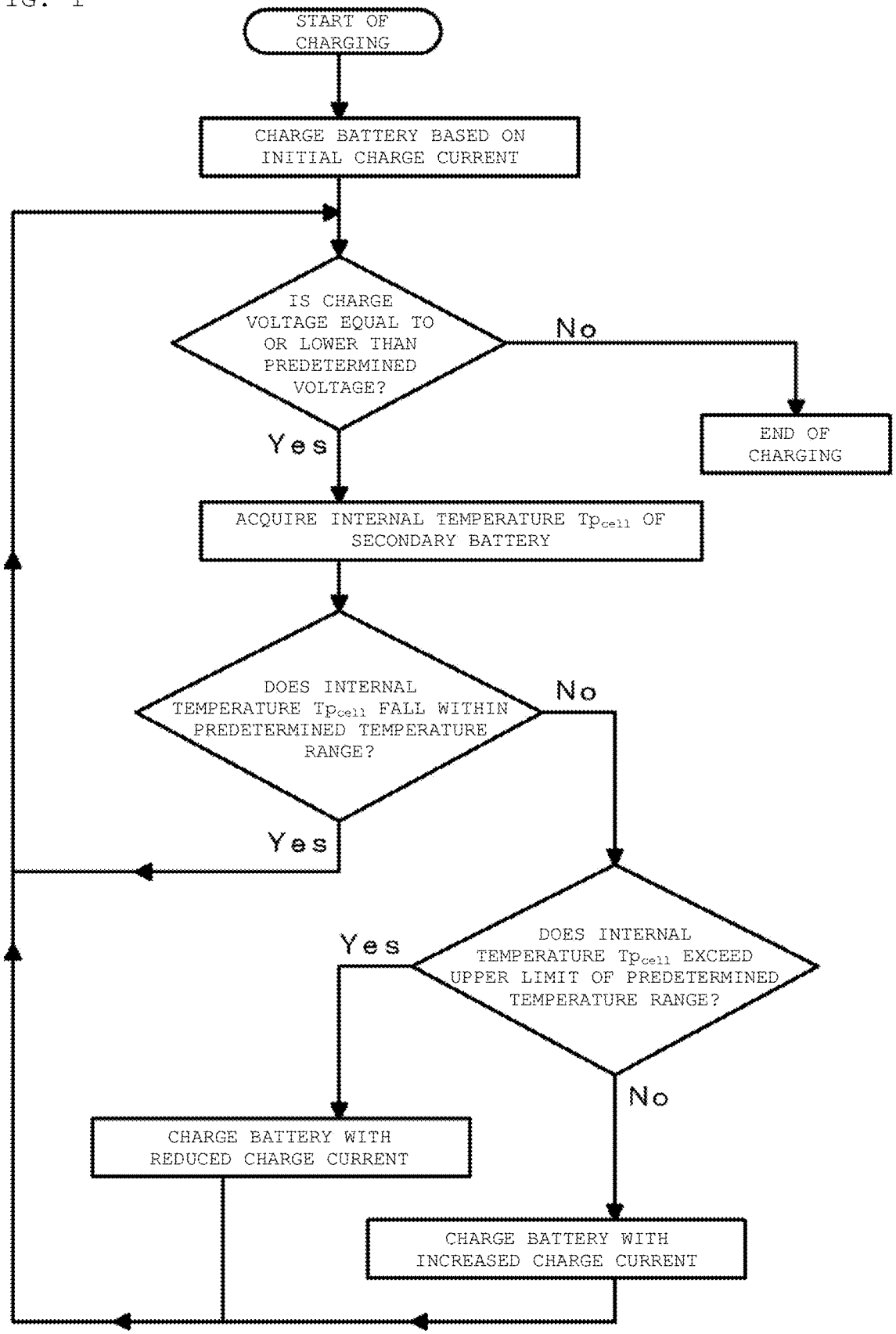
FIG. 1 is a flowchart for describing a charging method of a secondary battery in a first example according to an embodiment of the present disclosure.

The present disclosure generally relates to a secondary battery charging apparatus, a temperature information acquisition device, a secondary battery charging method, and an in-situ measurement method of an electrochemical impedance spectrum.

As described herein, the present disclosure will be described based on examples with reference to the drawings, but the present disclosure is not to be considered limited to the examples, and various numerical values and materials in the examples are considered by way of example.

In the secondary battery charging apparatus according to an embodiment of the present disclosure, the temperature information acquisition device can be configured to, during the charging of the secondary battery, determine M data sets in first to M-th degrees each of which includes (2N+1) charge current data (time response waveform of the charge current) consecutive in time series and (2N+1) charge voltage data (time response waveform of the charge voltage) consecutive in time series in an m-th degree, at a p-th unit time $t_p$ represented by Equation (A) above, where a time of length $T/(M \times 2^M)$ obtained by dividing a predetermined time T into $(N \times 2^M)$ is a unit time t. The temperature information acquisition device according to the embodiment of the present disclosure or the charging method of a secondary battery according to the embodiment of the present disclosure can be configured to, during the charging of the secondary battery, determine M data sets in first to M-th degrees each of which includes (2N+1) charge current data (time response waveform of the charge current) consecutive in time series and (2N+1) charge voltage data (time response waveform of the charge voltage) consecutive in time series in an m-th degree, at a p-th unit time $t_p$ represented by Equation (A) above, where a time of length $T/(M \times 2^M)$ obtained by dividing a predetermined time T into $(N \times 2^M)$ is a unit time t. In these configurations, it is possible to acquire the electrochemical impedance spectrum of the secondary battery based on the M data sets.

In the secondary battery charging apparatus according to an embodiment of the present disclosure including the foregoing preferred configurations, the temperature information acquisition device can be configured to subject the collected plural pieces of charge current data (time response waveform of the charge current) and charge voltage data (time response waveform of the charge voltage) to Fourier transform or Wavelet transform, determine the internal resistance value of the secondary battery based on the transform result, and acquire the internal temperature of the secondary battery from the internal resistance value. The temperature information acquisition device according to an embodiment of the present disclosure including the foregoing preferred configurations or the charging method of a secondary battery according to an embodiment of the present disclosure including the foregoing preferred configurations can be configured to subject the collected plural pieces of charge current data (time response waveform of the charge current) and charge voltage data (time response waveform of the charge voltage) to Fourier transform or Wavelet transform, determine the internal resistance value of the secondary battery based on the transform result, and acquire the internal temperature of the secondary battery from the internal resistance value. In these case, the secondary battery can have a positive-electrode member, a negative-electrode member, a separator, and an electrolyte, and the internal temperature of the secondary battery can be the temperature of the positive-electrode member, the temperature of the negative-electrode member, or the temperature of the electrolyte.

The charging methods of a secondary battery according to an embodiment of the present disclosure can be configured to measure the surface temperature of the secondary battery, estimate the internal temperature of the secondary battery from measurement result of the surface temperature, and when the difference between the estimated internal temperature of the secondary battery and acquired internal temperature of the secondary battery exceeds a predetermined temperature difference ΔTp, provide a notification of the fact. Specifically, the internal temperature of the secondary battery can be estimated, for example, by an equation obtained by analyzing a heat transfer model of the secondary battery based on a finite element method, from the internal resistance value of the secondary battery, the measured surface temperature of the secondary battery, the charge current of the secondary battery, and the charge voltage of the secondary battery (in some cases, an ambient temperature of the ambient surrounding the secondary battery may also be added). The predetermined temperature difference ΔTp can be 0.1 to 1° C. inclusive.

In the secondary battery charging apparatuses or the charging methods of a secondary battery according to an embodiment of the present disclosure, the secondary battery is charged while the charge current is controlled such that the acquired internal temperature of the secondary battery falls within a predetermined temperature range. The charge current can be controlled based on a proportional control (P control), a derivative control (D control), or a proportional-integral-derivative control (PID control). The P control, the D control, and the PID control can be performed by known control methods. In the PID control, the effect of the derivative control (D control) can be negative. When the secondary battery is a lithium-ion secondary battery, if metallic lithium becomes precipitated, the precipitation reaction of the metallic lithium is endothermic reaction and thus the temperature of the electrode surface drops. The precipitation of the metallic lithium is a cause of deterioration of the lithium-ion secondary battery. Therefore, the effect of the derivative control (D control) in the PID control is set to be negative, and when the electrode temperature drops precipitously, the charge current is reduced accordingly.

In the charging methods of a secondary battery according to an embodiment of the present disclosure, when the charge voltage reaches a predetermined value, the charging of the secondary battery is terminated. In some cases, after the charge voltage reaches the predetermined value, constant voltage charging (CV charging) can be performed before the termination of the charging.

In the secondary battery charging apparatuses according to an embodiment of the present disclosure, the temperature information acquisition devices according to an embodiment of the present disclosure, the charging methods of a secondary battery according to an embodiment of the present disclosure, and the in-situ measurement method of an electrochemical impedance spectrum of the present disclosure including the foregoing various preferred configurations (hereinafter, also called simply "the present disclosure"), the secondary battery can be a lithium-ion secondary battery as an example but is not limited to this. For example, the secondary battery can be a magnesium-ion battery, a metal-air secondary battery having a negative-electrode member containing negative-electrode active materials such as metal and alloy materials (examples of the metal and alloy materials include alkali metal such as tin, silicon, lithium, sodium, and potassium, group II elements such as magnesium and calcium, group III elements such as aluminum, transition metals such as zinc and iron, and alloy materials and compounds containing the foregoing metals), a lithium-sulfur secondary battery, a sodium-sulfur secondary battery, a sodium-nickel chloride secondary battery, a sodium ion secondary battery, a polyvalent cation secondary battery, various organic secondary batteries, and a nickel-hydrogen secondary battery. The configuration and structure of the secondary battery can be known configuration and structure.

In the present disclosure, one secondary battery may be provided or plural secondary batteries may be provided. In the latter case, the plural secondary batteries may be connected in series or in parallel, plural sets of secondary batteries connected in series may be connected in parallel as an assembled battery, or plural sets of secondary batteries connected in parallel may be connected in series as an assembled battery. In the assembled battery, all the secondary batteries constituting the assembled battery may be configured according to the present disclosure or some of the secondary batteries constituting the assembled battery may be configured according to the present disclosure. In the case of the assembled battery, it is possible to acquire the internal temperatures of the secondary batteries. In this case, the secondary batteries are charged while the charge current is controlled such that the acquired internal temperatures of the secondary batteries fall within the predetermined temperature range. In general, however, there are variations among the internal temperatures of the secondary batteries. Thus, the secondary batteries are charged while the charge current is controlled such that a temperature of the secondary battery having the highest internal temperature among the plural secondary batteries does not exceed the upper limit of the predetermined temperature range.

The charge current for charging the secondary battery may be pulsed charge current or continuous charge current. In the former case, the charge current for charging the secondary battery can be controlled by controlling the duty ratio. In the latter case, the charge current for charging the secondary battery can be controlled by controlling the value of the charge current itself. The charge control device itself can be of known configuration and structure. The temperature information acquisition device can have a known circuit configuration including an MPU, a CPU, and various storage media (for example, a memory). The charging control device and the temperature information acquisition device can be integrally configured. The lower limit of the predetermined temperature range can be 0 to 10° C. inclusive. The upper limit of the predetermined temperature range can be 50 to 60° C. inclusive. The temperature range can be 0 to 60° C. inclusive. However, the present disclosure is not limited to these values.

In the secondary battery charging apparatus according to an embodiment of the present disclosure, the temperature information acquisition device according to an embodiment of the present disclosure, and the charging method of a secondary battery according to a embodiment of the present disclosure, the frequency of the alternating current flown between the first lead portion and the second lead portion can be $1\times10^{-2}$ to $1\times10^5$ Hz inclusive, and the peak current value can be 5 to 20 mA inclusive, for example, but the present disclosure is not limited to these values. Flowing the alternating current between the first lead portion and the second lead portion makes it possible to acquire selectively information about a resistance component on the electrode surface based on a skin effect and determine the alternating-current impedance.

In the secondary battery charging apparatus according to an embodiment of the present disclosure, the temperature information acquisition device according to an embodiment of the present disclosure, and the charging method of a secondary battery according to an embodiment of the present disclosure, the electrode structure formed by the positive-electrode member, the separator, and the negative-electrode member may have the positive-electrode member, the separator, the negative-electrode member, and the separator in a wound state, or may have the positive-electrode member, the separator, the negative-electrode member, and the separator in a stacked state. In the secondary battery charging apparatus according to an embodiment of the present disclosure, the temperature information acquisition device according to an embodiment of the present disclosure, and the charging method of a secondary battery according to an embodiment of the present disclosure, in the secondary battery, the wound electrode structure has the positive-electrode member, the separator, the negative-electrode member, and the separator in a wound state.

The belt-like electrode structure or the wound electrode structure can be stored in a wound state in an electrode structure storage member or can be stored in a stacked state in the electrode structure storage member. In these cases, the outer shape of the electrode structure storage member can be cylindrical or square (flat plate shape). Examples of shape or form of the secondary battery include coin, button, disc, flat plate, square, cylinder, and laminate form (laminated film form).

Examples of materials for the electrode structure storage member (battery can) constituting a cylindrical secondary battery include iron (Fe), nickel (Ni), aluminum (Al), titanium (Ti), alloys of these metals, stainless steel (SUS), and others. The battery can is preferably plated with nickel or the like, for example, to prevent electrochemical corrosion due to charging and discharging of the secondary battery. The exterior member of a laminate-type (laminated film-type) secondary battery preferably has a laminated structure of a plastic material layer (fusion layer), a metallic layer, and a plastic material layer (surface protective layer), that is, a laminated film. In the case of a laminated film-type secondary battery, for example, the exterior member is folded such that the folded portions of the fusion layer are opposed to each other with the electrode structure interposed therebetween, and then the outer edges of the fusion layer are fused together. However, the exterior member may be formed by bonding two laminated films with an adhesive or the like. The fusion layer is formed from a film of an olefin resin such as polyethylene, polypropylene, modified polyethylene, or a polymer of these substances, for example. The metallic layer is formed from aluminum foil, stainless steel foil, or nickel foil, for example. The surface protective layer is formed from nylon, polyethylene terephthalate, for example. Among them, the exterior member is preferably an aluminum laminated film in which a polyethylene film, aluminum foil, and a nylon film are laminated in this order. However, the exterior member may be a laminated film of any other laminate structure, a polymer film of polypropylene, or a metallic film.

Descriptions will be given below as to constituent elements of the secondary battery in the present disclosure including the foregoing preferred modes and configurations that is a lithium-ion secondary battery providing the capacity of the negative-electrode member by occluding and releasing lithium as an electrode reaction substance.

In the lithium-ion secondary battery, the positive-electrode active material can contain lithium atoms. In the positive-electrode member, a positive-electrode active material layer is formed on one or both sides of a positive-electrode current collector. Examples of material for the positive-electrode current collector include copper (Cu), aluminum (Al), nickel (Ni), magnesium (Mg), titanium (Ti), iron (Fe), cobalt (Co), zinc (Zn), germanium (Ge), indium (In), gold (Au), platinum (Pt), silver (Ag), palladium (Pd), alloys containing any of the foregoing metals, and conductive materials such as stainless steel. The positive-electrode active material layer includes a positive-electrode active material capable of occluding and releasing lithium as a positive-electrode active material. The positive-electrode active material layer may further include a positive-electrode binding agent, a positive-electrode conducting agent, and the like. Examples of the positive electrode material include lithium-containing compounds (compounds containing lithium atoms). From the viewpoint of obtaining a high energy density, using a lithium-containing composite oxide or a lithium-containing phosphate compound is preferred. The lithium-containing composite oxide is an oxide containing lithium and one or more elements (hereinafter, called "other elements" with lithium excluded) as constituent elements in a layered rock-salt crystal structure or a spinel-type crystal structure. Specific examples of the lithium-containing composite oxide include lithium-cobalt materials, lithium-nickel materials, spinel manganate materials, and superlattice structure materials. The lithium-containing phosphate compound is a phosphate compound containing lithium and one or more elements (other elements) as constituent elements in an olivine-type crystal structure.

In the negative-electrode member, a negative-electrode active material layer is formed on one or both sides of a negative-electrode current collector. Examples of material for the negative-electrode current collector include copper (Cu), aluminum (Al), nickel (Ni), magnesium (Mg), titanium (Ti), iron (Fe), cobalt (Co), zinc (Zn), germanium (Ge), indium (In), gold (Au), platinum (Pt), silver (Ag), palladium (Pd), alloys containing any of the foregoing metals, and conductive materials such as stainless steel. The negative-electrode active material layer includes a negative-electrode active material capable of occluding and releasing lithium as a negative-electrode active material. The negative-electrode active material layer may further include a negative-electrode binding agent, a negative-electrode conducting agent, and the like. The negative-electrode binding agent and the negative-electrode conducting agent can be the same as the positive-electrode binding agent and the positive-electrode conducting agent. The surface of the negative-electrode current collector is preferably roughened from the viewpoint of improving the adhesion of the negative-electrode active material layer to the negative-electrode current collector based on the anchor effect. In this case, at least the surface of a region of the negative-electrode current collector where the negative-electrode active material layer is to be formed is roughened. Examples of a roughening method include forming fine grains by electrolytic treatment. The electrolytic treatment is a technique for providing asperities on the surface of the negative-electrode current collector by forming fine grains on the surface of the negative-electrode current collector using an electrolytic process in an electrolytic bath. Alternatively, the negative-electrode member may be formed from lithium foil, a lithium sheet, or a lithium plate.

The negative-electrode active material layer can be formed by, for example, a coating method, a gas phase method, a liquid phase method, a spraying method, or a firing method (sintering method). The coating method is a method for mixing a granular (powder) negative-electrode active material with a negative-electrode binding agent, dispersing the mixture in a solvent such as an organic solvent, and coating the negative-electrode current collector with the solvent. The gas phase method includes various physical vapor deposition (PVD) techniques such as vacuum deposition, sputtering, ion plating, and laser ablation, and various chemical vapor deposition (CVD) techniques such as plasma CVD. Examples of the liquid phase method include electrolytic plating and non-electrolytic plating. The spraying method is a method for spraying the molten or semi-molten negative-electrode active material onto the negative-electrode current collector. The firing method is a method for coating the negative-electrode current collector with a mixture dispersed in a solvent by a coating method and then subjecting the negative-electrode current collector to heat treatment at a higher temperature than the fusing point of the negative-electrode binding agent. Examples of the firing method include atmosphere firing, reaction firing, and hot press firing.

To prevent the accidental precipitation of lithium on the negative-electrode member, the chargeable capacity of the negative-electrode member is preferably larger than the discharge capacity of the positive-electrode member. That is, the electrochemical equivalent of the negative electrode material capable of occluding and releasing lithium is preferably larger than the electrochemical equivalent of the positive electrode material. In the case where the electrode reaction substance is lithium, for example, the lithium precipitated on the negative-electrode member is a lithium metal.

The positive-electrode lead portion can be attached to the positive-electrode current collector by spot welding or ultrasonic welding. The positive-electrode lead portion is desirably formed from net-like metal foil. However, the material for the positive-electrode lead portion may not be a metal as far as it is stable electrochemically and chemically and is electrically conductive. Examples of material for the positive-electrode lead portion include aluminum (Al) and others.

The negative-electrode lead portion can be attached to the negative-electrode current collector by spot welding or ultrasonic welding. The negative-electrode lead portion is desirably formed from net-like metal foil. However, the material for the positive-electrode lead portion may not be a metal as far as it is stable electrochemically and chemically and is electrically conductive. Examples of material for the negative-electrode lead portion include copper (Cu), nickel (Ni), and others.

Although depending on the configuration and structure of the secondary battery, the positive-electrode lead portion may constitute the first lead portion and the second lead portion or the negative-electrode lead portion may constitute the first lead portion and the second lead portion.

The separator is designed to separate the positive-electrode member and the negative-electrode member to let lithium ions pass while preventing a short-circuit resulting from the contact between the positive-electrode member and the negative-electrode member. The separator is formed from, for example, a porous film of a synthetic resin such as polyolefin-based resin (polypropylene resin or polyethylene resin), polyimide resin, polytetrafluoroethylene resin, polyvinylidene fluoride resin, polyphenylene sulfide resin, or aromatic polyamide, or a porous film of ceramic, or a non-woven fabric of glass fiber, liquid crystal polyester fiber, aromatic polyamide fiber, or cellulose fiber, or a non-woven fabric of ceramic. Among them, a porous film of polypropylene or polyethylene is preferred. The separator may be formed from a laminated film in which two or more kinds of porous films are laminated. The separator may be coated with an inorganic layer or may contain an inorganic substance. The thickness of the separator is preferably 5 to 50 μm inclusive, more preferably 7 to 30 μm inclusive. When the separator is too thick, the charging amount of the active material decreases to lower the battery capacity, and the ion conductivity decreases to lower the current characteristics. In contrast, when the separator is too thin, its mechanical strength decreases.

Examples of a lithium salt constituting a non-aqueous electrolyte solution to be suitably used in a lithium-ion secondary battery include, but not limited to, $LiPF_6$, $LiClO_4$, $LiBF_4$, $LiAsF_6$, $LiSbF_6$, $LiTaF_6$, $LiNbF_6$, $LiAlCl_4$, $LiCF_3SO_3$, $LiCH_3SO_3$, $LiN(CF_3SO_2)_2$, $LiC(CF_3SO_2)_3$, $LiC_4F_9SO_3$, $Li(FSO_2)_2N$, $Li(CF_3SO_2)_2N$, $Li(C_2F_5SO_2)_2N$, $Li(CF_3SO_2)_3C$, $LiBF_3(C_2F_5)$, $LiB(C_2O_4)_2$, $LiB(C_6F_5)_4$, $LiPF_3(C_2F_5)_3$, $\tfrac{1}{2}Li_2B_{12}F_{12}$, $Li_2SiF_6$, $LiCl$, $LiBr$, and $LiI$. Examples of the organic solvent include cyclic carbonate esters such as ethylene carbonate (EC), propylene carbonate (PC), and butylene carbonate (BC), chain carbonate esters such as dimethyl carbonate (DMC), ethyl methyl carbonate (EMC), diethyl carbonate (DEC), dipropyl carbonate (DPC), propyl methyl carbonate (PMC), and propyl ethyl carbonate (PEC), cyclic ethers such as tetrahydrofuran (THF), 2-methyltetrahydrofuran (2-MeTHF), 1,3-dioxolane (DOL), and 4-methyl-1,3-dioxolane (4-MeDOL), chain ethers such as 1,2-dimethoxyethane (DME) and 1,2-diethoxyethane (DEE), cyclic esters such as γ-butyrolactone (GBL) and γ-valerolactone (GVL), and chain esters such as methyl acetate, ethyl acetate, propyl acetate, methyl formate, ethyl formate, propyl formate, methyl butyrate, methyl propionate, ethyl propionate, and propyl propionate. In addition, examples of the organic solvent include tetrahydropyran, 1,3-dioxane, 1,4-dioxane, N,N-dimethylformamide (DMF), N,N-dimethylacetamide (DMA), N-methylpyrrolidinone (NMP), N-methyloxazolidinone (NMO), N,N'-dimethylimidazolidinone (DMI), dimethyl sulfoxide (DMSO), trimethyl phosphate (TMP), nitromethane (NM), nitroethane (NE), sulfolane (SL), methylsulfolane, acetonitrile (AN), anisole, propionitrile, glutaronitrile (GLN), adiponitrile (ADN), methoxy acetonitrile (MAN), 3-methoxypropionitrile (MPN), and diethyl ether. Alternatively, the organic solvent may be an ionic liquid. The ionic liquid can be selected as appropriate from publicly known conventional ones.

The non-aqueous electrolyte solution and a holding polymer compound can constitute an electrolyte layer. The non-aqueous electrolyte solution is held by the holding polymer compound, for example. The electrolyte layer in this mode is a gel-like electrolyte that provides a high ionic conductivity (for example, 1 mS/cm or more at ambient temperature) and prevents the leaking of the non-aqueous electrolyte solution. The electrolyte may be a liquid electrolyte or a gel-like electrolyte.

Specific examples of the holding polymer compound include polyacrylonitrile, polyvinylidene fluoride, polytetrafluoroethylene, polyhexafluoropropylene, polyethylene oxide, polypropylene oxide, polyphosphazen, polysiloxane, polyvinyl fluoride (PVF), polychlorotrifluoroethylene (PCTFE), perfluoroalkoxy fluorocarbon resin (PFA), tetrafluoroethylene-hexafluoropropylene copolymer (FEP), ethylene-tetrafluoroethylene copolymer (ETFE), ethylene-chlorotrifluoroethylene copolymer (ECTFE), polyvinyl acetate, polyvinyl alcohol, polymethylmethacrylate, polyacrylic acid, polymethacrylic acid, styrene-butadiene rubber, nitrile-butadiene rubber, polystyrene, polycarbonate, and vinyl chloride. They may be used singly or in combination. The holding polymer compound may be a copolymer. Specific examples of the copolymer include a copolymer of vinylidene fluoride and hexafluoropyrene. Among them, polyvinylidene fluoride as a homopolymer is preferred and a copolymer of vinylidene fluoride and hexafluoropyrene is preferred from the viewpoint of electrochemical stability. As a filler, a highly heat-resistance compound such as $Al_2O_3$, $SiO_2$, $TiO_2$, BN (boron nitride) may be included.

The secondary battery of the present disclosure can be used as a drive power supply or an auxiliary power supply for personal computers, various display devices, mobile information terminals including personal digital assistants (PDAs), cell phones, smartphones, cordless master phones and extensions, video cameras and camcorders, digital still cameras, electronic papers such as electronic books and electronic newspapers, electronic dictionaries, music players, mobile music players, radios, mobile radios, headphones, headphone stereos, game machines, navigation systems, memory cards, cardiac pacemakers, acoustic aids, electric tools, electric shavers, refrigerators, air conditioners, televisions, stereos, water heaters, microwave ovens, dishwashers, washing machines, clothes dryers, lighting equipment including interior lamps, various electric devices (including mobile electronic devices), toys, medical devices, robots, road conditioners, traffic signals, railway vehicles, caddie carts, electric carts, and electric cars (including hybrid vehicles). The secondary battery can be loaded in power sources for power storage in buildings such as houses or electric power facilities or can be used for supplying power to these power sources.

A secondary battery, a control unit (controller) including a processor for performing a control relating to a secondary battery, and a control unit in a battery pack having an exterior member enclosing a secondary battery can include the secondary battery charging apparatuses according to the first and second aspects of the present disclosure. A secondary battery in an electronic device that receives power supply from a secondary battery can include the secondary battery charging apparatuses according to the first and second aspects of the present disclosure.

A conversion device (converter) that receives power supply from a secondary battery and converts the same into driving force for a vehicle and a control device in an electric vehicle that has a control device configured to perform information processing relating to a vehicle control based on information about a secondary battery can include the secondary battery charging devices according to the first and second aspects of the present disclosure. In the electric vehicle, the conversion device typically receives power supply from the secondary battery and drives a motor to generate driving force. The motor may be driven by using regenerative energy. The control device performs information processing relating to vehicle control based on the remaining charge of the secondary battery, for example. Examples of the electric vehicle includes electric cars, electric motorcycles, electric bicycles, railway vehicles, and hybrid vehicles.

A secondary battery may be used in an electrical storage device in a smart grid. Such an electrical storage device can not only supply power but also receive power supplied from other power sources and storage the power. The electrical storage device can include the secondary battery charging apparatuses according to the first and second aspects of the present disclosure. Examples of other power sources include thermal power generation, nuclear power generation, hydraulic power generation, solar batteries, wind force power generation, geothermal power generation, fuel cells (including biofuel cells), and others.

A power storage system (or a power supply system) configured to receive power supplied from a secondary battery and/or supply power from a power source to a secondary battery can include the secondary battery and the secondary battery charging apparatuses according to the first and second aspects of the present disclosure. The power storage system may be any type of power storage system as far as it uses electric power, and it may be a simple power device. Examples of the power storage system includes a smart grid, a home energy management system (HEMS), a vehicle, and others, which are capable of power storage.

A power source for power storage having a secondary battery and configured to connect an electronic device to be supplied power can include the secondary battery and the secondary battery charging apparatuses according to the first and second aspects of the present disclosure. There is no limit on the use of the power source for power storage, and the power source for power storage can be used in any type of power storage system, power supply system, or power device. For example, the power source for power storage can be used in a smart grid.

Figure 2:
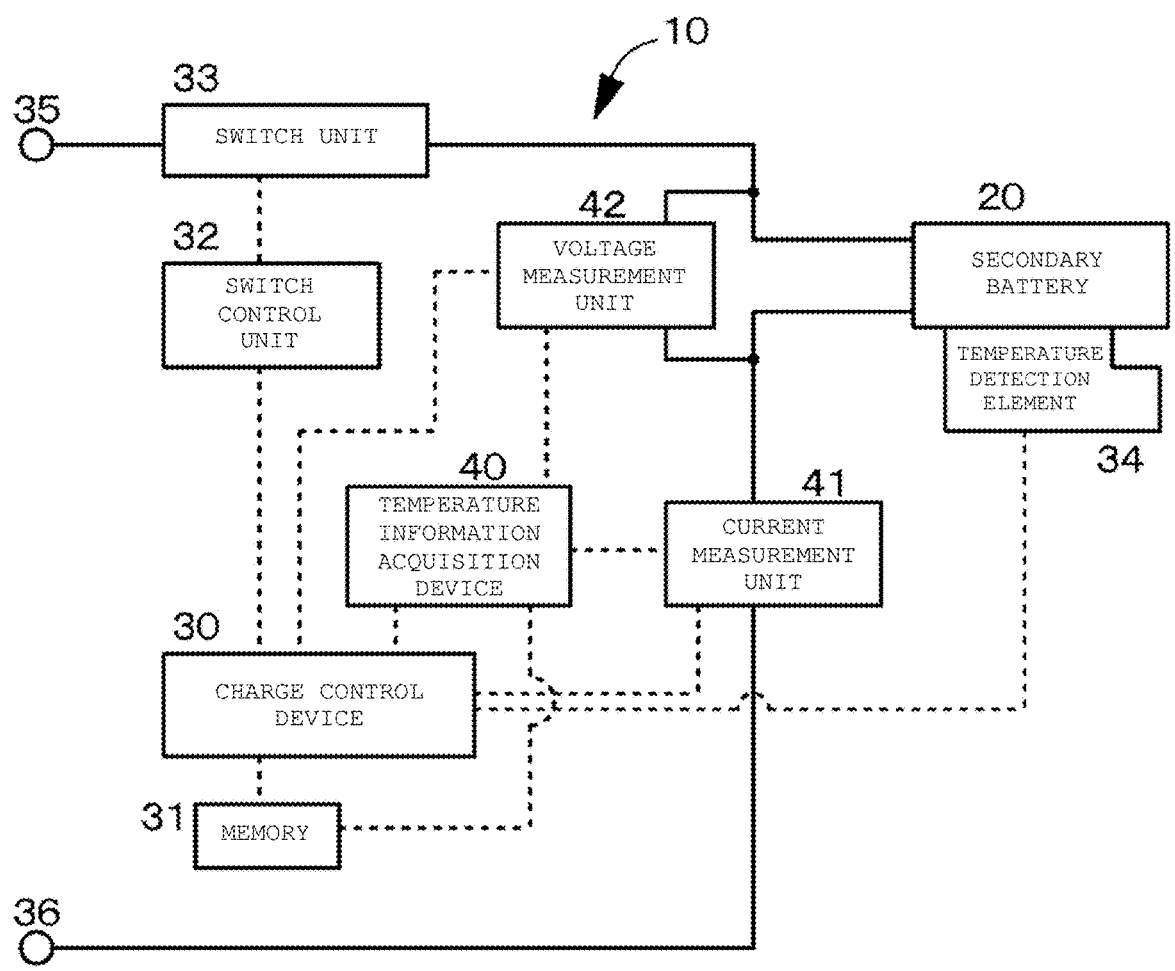
FIG. 2 is a conceptual view of a secondary battery charging apparatus and a temperature information acquisition device in the first example according to an embodiment of the present disclosure.
Figure 3:
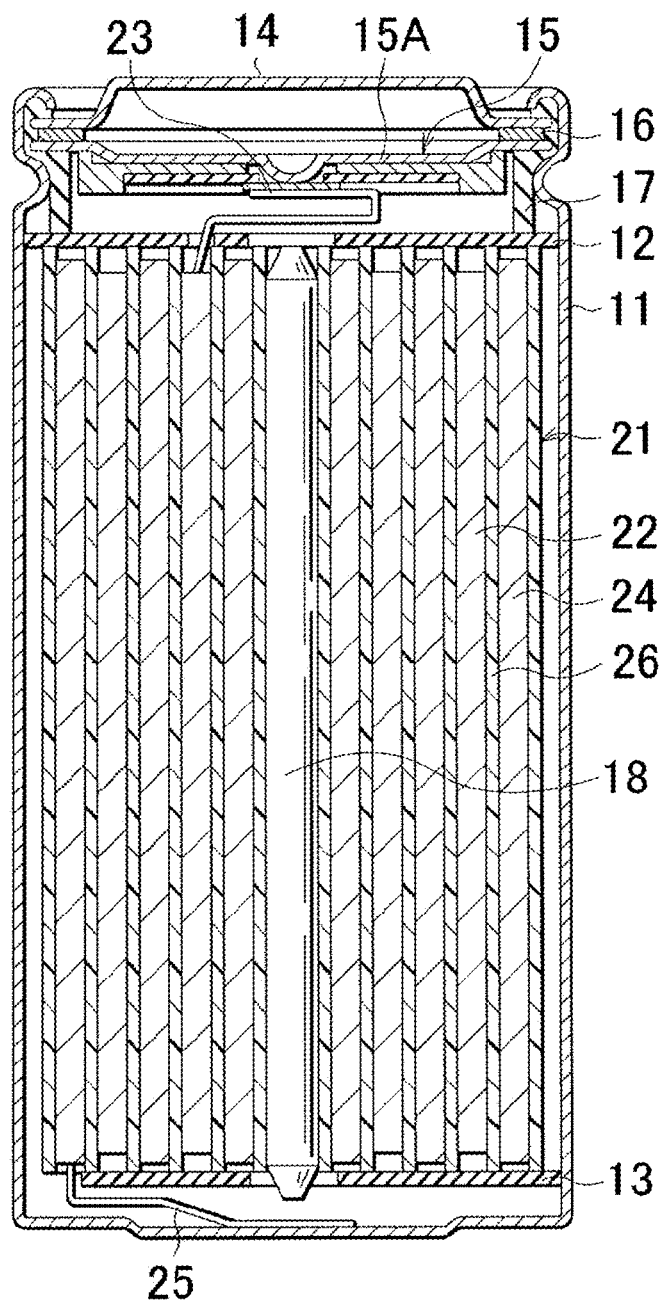
FIG. 3 is a schematic cross-sectional view of the secondary battery in the first example according to an embodiment of the present disclosure.
Figure 4:
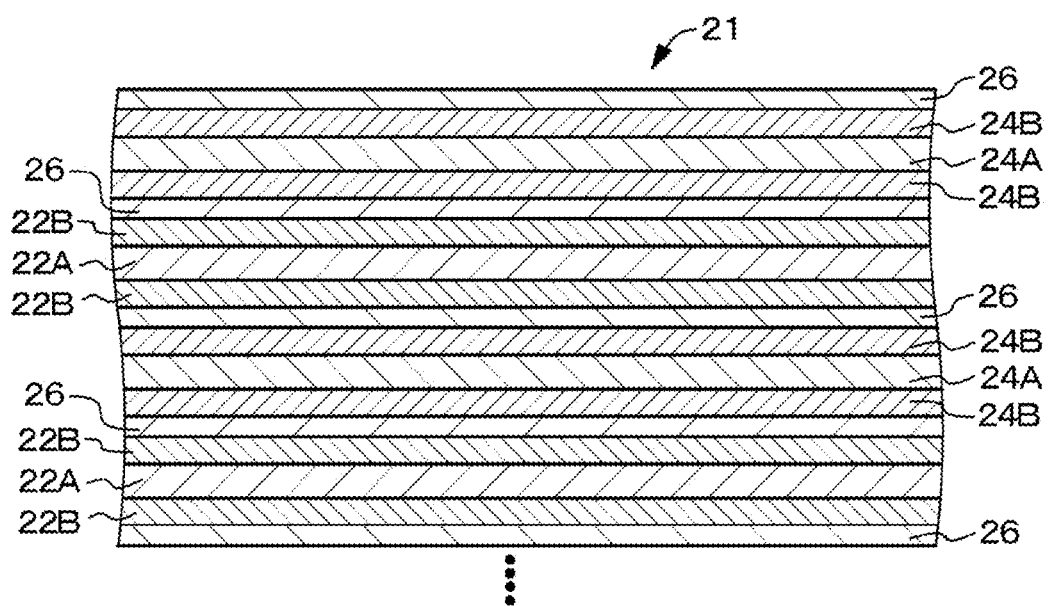
FIG. 4 is a schematic partial cross-sectional view of a wound electrode laminated body in the secondary battery in the first example according to an embodiment of the present disclosure.

A first example relates to the secondary battery charging apparatus according to an embodiment of the present disclosure, the temperature information acquisition device according the first aspect of the present disclosure, the charging method of a secondary battery according to the first aspect of the present disclosure, and the in-situ measurement method of an electrochemical impedance spectrum of the present disclosure. FIG. 1 is a flowchart for describing a charging method of a secondary battery in the first example. FIG. 2 is a conceptual diagram of a secondary battery charging apparatus and a temperature information acquisition device in the first example 1. FIG. 3 is a schematic cross-sectional view of the secondary battery in the first example. FIG. 4 is a schematic partial cross-sectional view of a wound electrode laminated body in the secondary battery in the first example. In FIG. 2, flows of current are indicated with solid lines and flows of signals or the like are indicated with dotted lines.

As illustrated in the conceptual diagram of FIG. 2, a secondary battery charging apparatus 10 in the first example includes a charge control device 30 that controls charge current for charging a secondary battery 20 and a temperature information acquisition device 40 that acquires an internal temperature $Tp_{cell}$ of the secondary battery 20. During charging of the secondary battery, the temperature information acquisition device 40 collects plural pieces of charge current data and charge voltage data in time series and acquires the internal temperature $Tp_{cell}$ of the secondary battery 20 based on the collected plural pieces of charge current data and charge voltage data. The charge control device 30 charges the secondary battery 20 while controlling the charge current for charging the secondary battery 20 such that the internal temperature $Tp_{cell}$ of the secondary battery 20 acquired by the temperature information acquisition device 40 falls within a predetermined temperature range.

The temperature information acquisition device 40 in the first example is a temperature information acquisition device that acquires the internal temperature $Tp_{cell}$ of the secondary battery 20. During the charging of the secondary battery, the temperature information acquisition device 40 collects the plural pieces of charge current data and charge voltage data in time series and acquires the internal temperature $Tp_{cell}$ of the secondary battery 20 based on the collected plural pieces of charge current data and charge voltage data.

Although described later in detail, in the secondary battery charging apparatus 10 and the temperature information acquisition device 40 in the first example and in a charging method of a secondary battery in the first example 1 described later, during the charging of the secondary battery, the temperature information acquisition device 40 determines M data sets in first to M-th degrees each of which includes (2N+1) charge current data (time response waveform of the charge current) consecutive in time series and (2N+1) charge voltage data (time response waveform of the charge voltage) consecutive in time series in an m-th degree, at a p-th unit time $t_p$ represented by Equation (A) above, where a time of length $T/(M \times 2^M)$ obtained by dividing a predetermined time T into $(N \times 2^M)$ is a unit time t. Then, the temperature information acquisition device 40 acquires an electrochemical impedance spectrum of the secondary battery 20 based on the M data sets.

In the secondary battery charging apparatus 10 and the temperature information acquisition device 40 in the first example and in the charging method of a secondary battery in the first example 1 described later, the temperature information acquisition device 40 subjects the collected plural pieces of charge current data (time response waveform of the charge current) and charge voltage data (time response waveform of the charge voltage) to Fourier transform or Wavelet transform (specifically, Wavelet transform in the first example), determines an internal resistance value of the secondary battery 20 (for example, a charge transfer resistance value of a negative electrode) based on the transform result, and acquires the internal temperature $Tp_{cell}$ of the secondary battery 20 from the internal resistance value. The internal temperature $Tp_{cell}$ of the secondary battery 20 is, specifically, the temperature of a positive-electrode member 22, the temperature of a negative-electrode member 24, or the temperature of an electrolyte. More specifically, in the first example, the internal temperature $Tp_{cell}$ of the secondary battery 20 is the temperature of the negative-electrode member 24.

The internal resistance value of the secondary battery 20 has strong temperature dependency. Therefore, determining the internal resistance value makes it possible to acquire the internal temperature $Tp_{cell}$ of the secondary battery 20 from the internal resistance value. The relationship between the internal resistance value and the internal temperature $Tp_{cell}$ of the secondary battery 20 is determined in advance by conducting various tests, and is stored in advance in a storage medium included in the temperature information acquisition device 40 (a memory 31 described later).

The secondary battery 20 has the positive-electrode member 22, the negative-electrode member 24, a separator 26, and the electrolyte (electrolyte layer 28). The secondary battery 20 in the first example is formed from a lithium-ion secondary battery. Although the secondary battery 20 will be described later in detail, the overcharge detection voltage of a lithium-ion secondary battery is 4.20 V±0.05 V, for example, and the overdischarge detection voltage of a lithium-ion secondary battery is 2.4 V±0.1 V, for example. The foregoing matter is also applicable to the secondary batteries in the examples described later.

The charge control device 30 controlling the entire operation of the secondary battery 20 includes a central processing unit (CPU), a memory 31, and others. The charge control device 30 further includes a switch control unit 32, a switch unit 33, a temperature detection element 34, and external terminals 35 and 36. The external terminals 35 and 36 are terminals that are connected to external devices operated by the secondary battery 20 (for example, personal computers) and external devices for use in charging the secondary battery 20 (for example, chargers). The temperature information acquisition device 40 includes a central processing unit (CPU), the memory 31, a current measurement unit 41, and a voltage measurement unit 42. The charge control device 30 and the temperature information acquisition device 40 are integrated. The central processing unit (CPU) and the memory 31 constituting the charge control device 30 also act as the central processing unit (CPU) and the memory 31 constituting the temperature information acquisition device 40.

The switch unit 33 switches the usage state of the secondary battery 20 (connectivity and non-connectivity between the secondary battery 20 and the external device) in response to the instruction from the charge control device 30. The switch unit 33 includes, for example, a charge control switch, a discharge control switch, a charge diode, and a discharge diode (none are illustrated). Each of the charge control switch and the discharge control switch is formed from, for example, a semiconductor switch such as field-effect transistor (MOSFET) using a metal-oxide-semiconductor.

The temperature detection element 34 formed from a thermistor or the like is attached to the outer surface of the secondary battery 20 and is connected to the charge control device 30. The result of measurement by the temperature detection element 34 is used, for example, for a charge/discharge control by the charge control device 30 in the event of abnormal heat and for a correction process at the time of calculation of remaining capacity by the charge control device 30.

The current measurement unit 41 measures charge current and discharge current by using a current detection resistor (not illustrated), and outputs the measurement result to the charge control device 30 and the temperature information acquisition device 40. The voltage measurement unit 42 measures the voltage of the secondary battery 20, and subjects the measured voltage to analog-digital conversion and outputs to the charge control device 30 and the temperature information acquisition device 40.

The charge control device 30 controls the operation of the switch unit 33 via the switch control unit 32 according to the signals from the current measurement unit 41 and the voltage measurement unit 42. When the battery voltage reaches the overcharge detection voltage, for example, the switch control unit 32 turns off the switch unit 33 (charge control switch) to control the charge current so as not to flow into the current path of the secondary battery 20. Accordingly, the secondary battery 20 becomes capable of only discharging via the discharge diode. When a large current flows during the charging, for example, the switch control unit 32 shuts off the charge current. Further, when the battery voltage reaches the overdischarge detection voltage, for example, the switch control unit 32 turns off the switch unit 33 (discharge control switch) such that the charge current does not flow into the current path of the secondary battery 20. Accordingly, the secondary battery 20 becomes capable of only charging via the charge diode. When a large current flows during discharging, for example, the switch control unit 32 shuts off the discharge current.

The memory 31 is formed from an EEPROM as a non-volatile memory, for example. The memory 31 stores, for example, numerical values calculated by the charge control device 30, information on the secondary battery 20 measured in the production process (for example, initial internal resistance and the like). Storing the full charge capacity of the secondary battery 20 in the memory 31 allows the charge control device 30 to grasp information such as the remaining capacity.

The charge control device 30 described above is also applicable to the examples described later.

The charging method of a secondary battery and the in-situ measurement method of an electrochemical impedance spectrum in the first example will be described below. The charging method of the secondary battery 20 in the first example includes: during the charging of the secondary battery, collecting plural pieces of charge current data and charge voltage data in time series; acquiring the internal temperature $Tp_{cell}$ of the secondary battery 20 based on the collected plural pieces of charge current data and charge voltage data; and charging the secondary battery 20 while controlling charge current such that the acquired internal temperature $Tp_{cell}$ of the secondary battery 20 falls within a predetermined temperature range.

Specifically, the secondary battery 20 is connected to an external device (for example, a charger or the like) for use in charging the secondary battery 20 via the external terminals 35 and 36. First, the charge control device 30 starts charging of the secondary battery 20 based on initial charge current $I_{initial}$. The initial charge current $I_{initial}$ is 0.7 C, for example. However, the value of the initial charge current is not limited to this. During charging of the secondary battery 20, the charge control device 30 continues to measure the value of the charge current flowing in the secondary battery 20, the value of the charge voltage of the secondary battery 20, and the surface temperature of the secondary battery 20 by the current measurement unit 41, the voltage measurement unit 42, and the temperature detection element 34.

After a lapse of a time $T_0$ since from the start of charging, the temperature information acquisition device 40 starts to collect the plural pieces of charge current data and charge voltage data in time series by the current measurement unit 41 and the voltage measurement unit 42. The time $T_0$ can be decided in advance by conducting various tests. That is, at the start of charging, the internal temperature $Tp_{cell}$ of the secondary battery 20 is an unsteady state. After charging for a certain time, the internal temperature $Tp_{cell}$ of the secondary battery 20 enters a quasi-steady state. The time from the start of charging to the instant when the internal temperature $Tp_{cell}$ of the secondary battery 20 enters a quasi-steady state is determined in advance and set as time $T_0$.

The timing for collecting the plural pieces of charge current data and charge voltage data in time series and the method for acquiring the internal temperature $Tp_{cell}$ of the secondary battery 20 based on the collected plural pieces of charge current data and charge voltage data will be described later.

The temperature information acquisition device 40 determines whether the acquired internal temperature $Tp_{cell}$ of the secondary battery 20 falls within a predetermined temperature range. When determining that the acquired internal temperature $Tp_{cell}$ of the secondary battery 20 falls within a predetermined temperature range, the temperature information acquisition device 40 sends a signal indicating to the effect to the charge control device 30, and the charge control device 30 holds the charge current to continue charging of the secondary battery 20.

When the temperature information acquisition device 40 determines that the acquired internal temperature $Tp_{cell}$ of the secondary battery 20 exceeds an upper limit $Tp_{max}$ of the predetermined temperature range, the secondary battery 20 is charged with a current value obtained by subtracting a predetermined current value from the present charge current. The upper limit $Tp_{max}$ of the temperature range can be 50 to 60° C. inclusive, specifically 60° C. As the predetermined current value to be subtracted, a current value with $(Tp_{max}-Tp_{cell})$ as a parameter can be stored in advance in the memory 31. The temperature information acquisition device 40 reads this value and instructs the charge control device 30 to charge the secondary battery 20 based on the new value of the charge current. Alternatively, the predetermined current value to be subtracted may be a constant value.

On the other hand, when the temperature information acquisition device 40 determines that the acquired internal temperature $Tp_{cell}$ of the secondary battery 20 falls below a lower limit $Tp_{min}$ of the predetermined temperature range, the secondary battery 20 is charged with a current value obtained by adding a predetermined current value to the present charge current. The lower limit $Tp_{min}$ of the temperature range can be 0 to 10° C. inclusive, specifically 0° C. As the predetermined current value to be added, a current value with $(Tp_{cell}-Tp_{min})$ as a parameter can be stored in advance in the memory 31. The temperature information acquisition device 40 reads this value and instructs the charge control device 30 to charge the secondary battery 20 based on the new value of the charge current. Upon receipt of the instruction, the charge control device 30 charges the secondary battery 20 based on the new value of the charge current. Alternatively, the predetermined current value to be added may be a constant value.

In this way, the secondary battery is charged while the charge current is controlled such that the acquired internal temperature of the secondary battery falls within the predetermined temperature range. The control of the charge current can be performed based on the known P control, D control, or PID control. In the PID control, the effect of the D control is preferably negative as described above.

When the charge voltage of the secondary battery 20 measured by the voltage measurement unit 42 reaches a predetermined value, the charge control device 30 terminates the charging of the secondary battery 20. When the charge voltage does not reach the predetermined value, the processes of collecting the plural pieces of charge current data and charge voltage data in time series, acquiring the internal temperature $Tp_{cell}$ of the secondary battery 20 based on the collected plural pieces of charge current data and charge voltage data, and controlling the charge current such that the acquired internal temperature $T_{cell}$ of the secondary battery 20 falls within the predetermined temperature range, are repeatedly executed.

When the charge voltage of the secondary battery 20 measured by the voltage measurement unit 42 reaches a predetermined value, the charging may be completed by switching to constant voltage (CV) charging and terminating the CV charging.

The entire flow of the method for charging a secondary battery described above is also applicable to the examples described later.

The timing for collecting the plural pieces of charge current data and charge voltage data and the method for acquiring the internal temperature $Tp_{cell}$ of the secondary battery 20 based on the collected plural pieces of charge current data and charge voltage data will be described below. In the first example, in the course of acquiring the internal temperature $Tp_{cell}$ of the secondary battery 20 based on the collected charge current data and charge voltage data, the in-situ measurement method of an electrochemical impedance spectrum of the present disclosure is executed.

Specifically, in the in-situ measurement method of an electrochemical impedance spectrum in the first example, during the charging of the secondary battery, M data sets are collected in first to M-th degrees each of which includes (2N+1) charge current data consecutive in time series and (2N+1) charge voltage data consecutive in time series, where N is a positive integer, and an electrochemical impedance spectrum of the secondary battery 20 is acquired based on the M data sets. Then, (2N+1) charge current data and (2N+1) charge voltage data in an m-th degree, where m=1, 2, 3, ... M, are determined at a p-th unit time $t_p$ represented by Equation (A) below, where a time of length $T/(M \times 2^M)$ obtained by dividing a predetermined time T into $(N \times 2^M)$ is a unit time t:

where n=0, 1, 2 ... 2N.

$$p = N \times 2^{M-1} + (-N+n) \times 2^{m-1} \qquad (A)$$

Specifically, under control of the temperature information acquisition device 40, the plural pieces of charge current data and charge voltage data are collected in time series by the current measurement unit 41 and the voltage measurement unit 42.

Figure 6A:
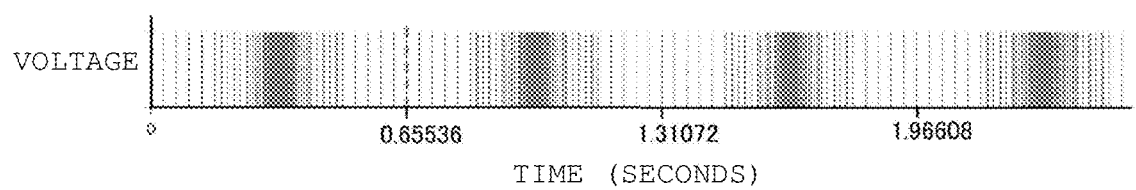
FIG. 6A is a diagram illustrating a data acquisition cycle of M sets of data and FIG. 6B is a diagram indicating the values of "p" in the m-th degrees in a representation different from that in FIG. 5, in the in-situ measurement method of an electrochemical impedance spectrum in the first example according to an embodiment of the present disclosure.
Figure 6B:
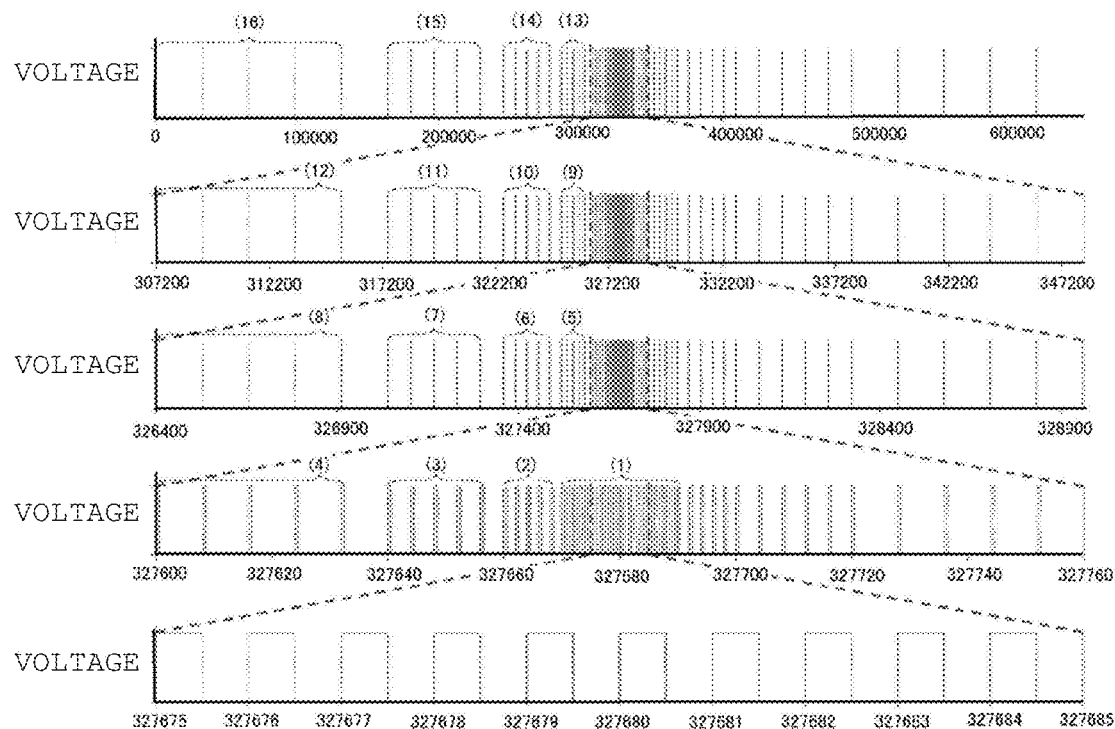

In the first example, (N,M)=(10,16). The length of the unit time t is set to one microsecond. That is, $t=T/(M \times 2^M)=T/(10 \times 2^{16})=$ one microsecond. The time necessary for acquiring one data set in the first degree (m=1) is 21 microseconds. The time necessary for acquiring one data set in the second degree (m=2) is 42 microseconds. The time necessary for acquiring one data set in the M-th degree (m=M=16) is 0.655 microseconds. The charge current data and the charge voltage data were collected at the start of the unit time. FIGS. 5 and 6B indicate the values of "p" in the m-th degree according to Equation (A). FIG. 6A indicates the data acquisition cycle of the M data sets.

For example, when the values of "p" in the first degree are compared to the values of "p" in the second degree, there is a match between:
the value of "p" with n=0 in the first degree and the value of "p" with n=5 in the second degree;
the value of "p" with n=2 in the first degree and the value of "p" with n=6 in the second degree;
the value of "p" with n=4 in the first degree and the value of "p" with n=7 in the second degree;
the value of "p" with n=6 in the first degree and the value of "p" with n=8 in the second degree;
the value of "p" with n=8 in the first degree and the value of "p" with n=9 in the second degree;
the value of "p" with n=10 in the first degree and the value of "p" with n=10 in the second degree;
the value of "p" with n=12 in the first degree and the value of "p" with n=11 in the second degree;
the value of "p" with n=14 in the first degree and the value of "p" with n=12 in the second degree;
the value of "p" with n=16 in the first degree and the value of "p" with n=13 in the second degree;
the value of "p" with n=18 in the first degree and the value of "p" with n=14 in the second degree;
the value of "p" with n=20 in the first degree and the value of "p" with n=15 in the second degree;

That is, the number of charge current data and charge voltage originally required in the first degree is 21 (=2×10+1), but the 11 charge current data and charge voltage data overlap the charge current data and charge voltage data in the second degree. Thus, only the 10 charge current data and charge voltage data need to be obtained in the first degree. Therefore, the numbers of the charge current data and charge voltage data required in the first to 16th degree are 10×15+21-1=170. The number of the data in the positive temperature coefficient element 16th degree is decreased by one because the last data in the positive temperature coefficient element 16th degree is the same as the first data in the first degree in the next measurement cycle. When there is no overlap in the charge current data and the charge voltage data, the numbers of necessary charge current data and charge voltage data in the first to 16th degree are 21×16=336.

As described above, nesting data different in degree (corresponding frequency) (charge current data and charge voltage data) in multiple stages (16 stages in the first example) and sharing these data makes it possible to reduce the number of charge current data and charge voltage data to be acquired as much as possible. That is, according to the in-situ measurement method of an electrochemical impedance spectrum in the first example, it is possible to decrease the numbers of charge current data and charge voltage data (to be collected) by 49%, thereby shortening the time of data processing and reduce a load on the temperature information acquisition device 40.

Figures 7A, 7B:
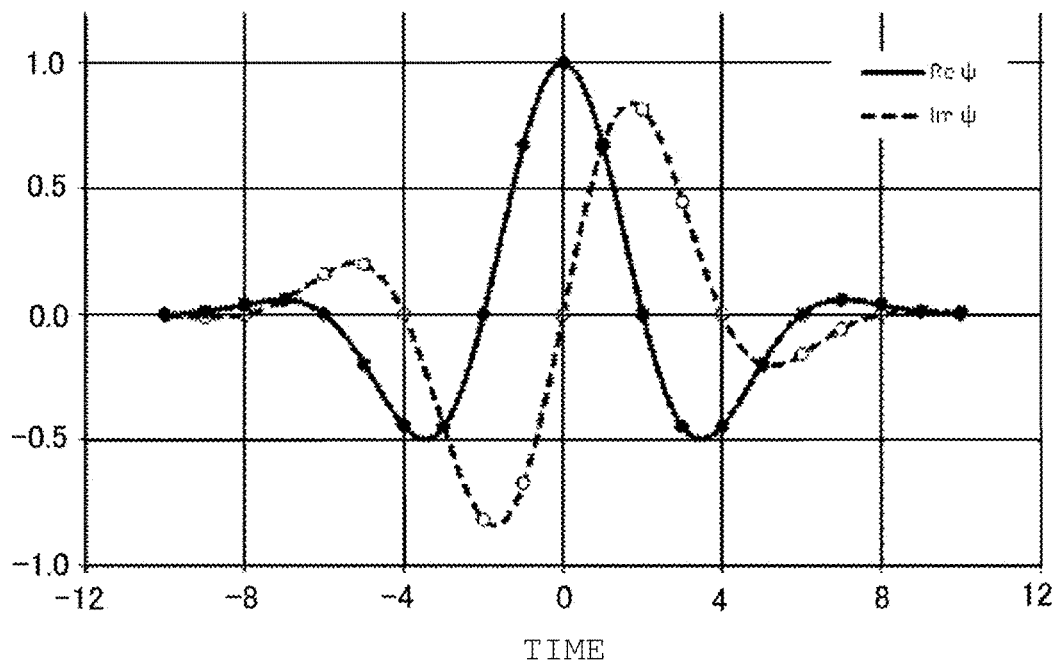
FIG. 7A is a graph indicating changes in values of real part and imaginary part of mother wavelet transform function Ψ with time as a parameter.
FIG. 7B is a table showing the values of the real part and imaginary part of the mother wavelet transform function Ψ with the value of (2N+1) as a parameter.

The mother wavelet transform function $\Psi$ can be expressed, for example, by Equation (B) below where t represents time (specifically, unit time) and j represents complex unit. FIG. 7A indicates changes in the value of the real part (indicated by the solid line in FIG. 7A) and the value of the imaginary part (indicated with the broken line in FIG. 7A) of the mother wavelet transform function $\Psi$ with time as a parameter, and FIG. 7B indicates the values of the real part and the imaginary part of the mother wavelet transform function $\Psi$ with the value of (2N+1) as a parameter.

$$\psi = \exp\{-t^2/(19.63689619) + j \cdot (\pi \cdot t)/4\} \tag{B}$$

The value of the coefficient "19.63689619 ($\equiv \alpha$)" is selected such that the value of a measurement point on the mother wavelet transform function $\Psi$ constitutes a simple integer ratio. Accordingly, the in-situ measurement method of an electrochemical impedance spectrum in the first example can be coded by integer-type description, not floating point-type description, thereby to achieve higher-speed processing.

Then, one collected data set ((2N+1) charge current data and (2N+1) charge voltage data) is subjected to Wavelet transform. That is, the temporally continuous (2N+1) (=21) charge current data $I(t_{m,p})$ and charge voltage data $V(t_{m,p})$ obtained in the m-th degree are substituted into Equations (B-1) and (B-2) to determine complex current $^{C}I_m$ and complex voltage $^{C}V_m$ in the m-th degree. The symbol "s" means adding up n=0 to n=(2N+1), which results in $\alpha$=19.63689619.

$$^{C}I_m = \Sigma[I(t_{m,p}) \exp[-\{(-N+n)\}^2/\alpha + j \cdot \{\pi \cdot (-N+n)\}/4] \tag{B-1}$$

$$^{C}V_m = \Sigma[V(t_{m,p}) \exp[-\{(-N+n)\}^2/\alpha + j \cdot \{\pi \cdot (-N+n)\}/4] \tag{B-2}$$

Specifically, for example, complex current $^{C}I_1$ in the first degree can be determined by the following equation:

$$\begin{aligned}c_{I_1} = &\ I(t_{327670})\exp[-(-10)^2/\alpha + j \cdot (\pi(-10)/4] + \\ & I(t_{327671})\exp[-(-9)^2/\alpha + j \cdot (\pi(-9)/4] + \\ & I(t_{327672})\exp[-(-8)^2/\alpha + j \cdot (\pi(-8)/4] + \\ & I(t_{327673})\exp[-(-7)^2/\alpha + \\ & j \cdot (\pi(-7)/4] + I(t_{327674})\exp[-(-6)^2/\alpha + j \cdot (\pi(-6)/4] + \\ & I(t_{327675})\exp[-(-5)^2/\alpha + j \cdot (\pi(-5)/4] + \\ & I(t_{327676})\exp[-(-4)^2/\alpha + j \cdot (\pi(-4)/4] + \\ & I(t_{327677})\exp[-(-3)^2/\alpha + j \cdot (\pi(-3)/4] + \\ & I(t_{327678})\exp[-(-2)^2/\alpha + \\ & j \cdot (\pi(-2)/4] + I(t_{327679})\exp[-(-1)^2/\alpha + j \cdot (\pi(-1)/4] + \\ & I(t_{327680}) + I(t_{327681})\exp[-(1)^2/\alpha + j \cdot (\pi(1)/4] + \\ & I(t_{327681})\exp[-(1)^2/\alpha + j \cdot (\pi(1)/4] + \\ & I(t_{327682})\exp[-(2)^2/\alpha + j \cdot (\pi(2)/4] + \\ & I(t_{327683})\exp[-(3)^2/\alpha + j \cdot (\pi(3)/4] + \\ & I(t_{327684})\exp[-(4)^2/\alpha + j \cdot (\pi(4)/4] + \\ & I(t_{327685})\exp[-(5)^2/\alpha + j \cdot (\pi(5)/4] + \\ & I(t_{327686})\exp[-(6)^2/\alpha + j \cdot (\pi(6)/4] + \\ & I(t_{327687})\exp[-(7)^2/\alpha + j \cdot (\pi(7)/4] + \\ & I(t_{327688})\exp[-(8)^2/\alpha + j \cdot (\pi(8)/4] + \\ & I(t_{327689})\exp[-(9)^2/\alpha + j \cdot (\pi(9)/4] + \\ & I(t_{327690})\exp[-(10)^2/\alpha + j \cdot (\pi(10)/4]\end{aligned}$$

Figure 18A:
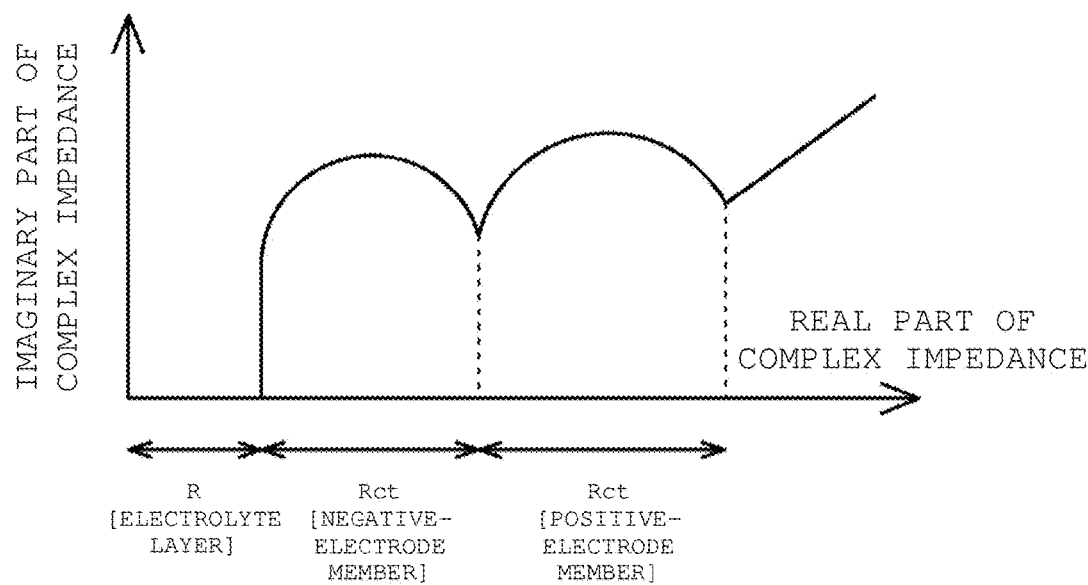
FIGS. 18A and 18B are respectively a schematic view of a Nyquist plot and an equivalent circuit diagram of a positive-electrode member, a negative-electrode member, and an electrolyte (electrolyte layer).
Figure 18B:
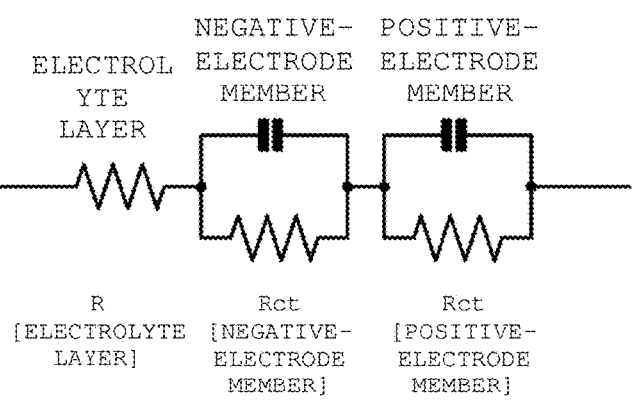

Then, the complex voltage $^{C}V_m$ in the m-th degree is divided by the complex current $^{C}I_m$ in the m-th degree to determine a complex impedance in the m-th degree. Accordingly, the complex impedances in the M (=16) degrees, that is, the complex impedances with 16 measurement frequencies (sweep ranges) can be obtained. Then, the M complex impedances are plotted on a complex plane to obtain an electromechanical impedance spectrum (specifically, Nyquist plot (also called Cole-Cole plot)). Then, the internal resistance value of the secondary battery is determined based on the Nyquist plot, and the internal temperature $Tp_{cell}$ of the secondary battery is acquired from the internal resistance value. The relationship between the internal resistance value and the internal temperature $Tp_{cell}$ of the secondary battery is determined in advance by conducting various tests and stored in the memory 31 included in the temperature information acquisition device 40. An electrode reaction resistance component $R_{ct}$ in the Nyquist plot can be determined by, for example, the nonlinear least square method described in the reference literature "Computer program for nonlinear least square analysis of impedance and admittance data.pdf". When the reaction resistance component $R_{ct}$ is obtained, the electrode temperature can be calculated by the Arrhenius equation. The reference document "Effects of temperature on charge-discharge behaviors of LiFePO$_4$ cathode for Li-ion batteries.pdf" states that the Arrhenius equation holds between the reaction resistance component $R_{ct}$ and the electrode surface temperature. This reference document also describes the constants in the Arrhenius equation (frequency factor and activation energy). In actuality, however, the constants of the secondary battery can be determined in advance for later use. In the relationship between the internal resistance value and the internal temperature $Tp_{cell}$ of the secondary battery, when the secondary battery is put into a constant-temperature bath and left stand for about 30 minutes, for example, the internal temperature of the secondary battery and the temperature of the constant-temperature chamber become identical. That is, (the internal temperature of the secondary battery)=(the surface temperature of the secondary battery)=(the preset temperature of the constant-temperature bath). In this state, the alternating-current impedance (complex impedance) is measured to determine the internal resistance value (reaction resistance component $R_{ct}$ and others). Then, this measurement is performed at various temperatures with changes in the preset temperature of the constant-temperature bath to obtain the relationship between the internal resistance value and the internal temperature $Tp_{cell}$ of the secondary battery (the preset temperature of the constant-temperature bath). FIG. 18A is a schematic diagram of the Nyquist plot, and FIG. 18B is an equivalent circuit diagram of the positive-electrode member 22, the negative-electrode member 24, and the electrolyte (electrolyte layer 28). FIG. 18A also indicates the value of the lateral axis of the Nyquist plot (the real part of the complex impedance) and the relationships among the resistance component R (electrolyte layer) of the electrolyte layer 28, the reaction resistance component $R_{ct}$ (negative-electrode member), and the reaction resistance component $R_{ct}$ (positive-electrode member).

To verify an algorithm for the in-situ measurement method of an electrochemical impedance spectrum in the first example, a function generator (TEXIO FG-281) and data loggers (national instruments PCIe-6351) that allow programming of data acquisition timing in an arbitrary manner were prepared. The two data loggers of the same model were prepared and set such that they were completely synchronized in data acquisition timing. The waveform generated by the function generator and the data acquisition timing trigger signals from the data loggers were checked by an oscilloscope (YOKOGAWA DL9040L). A triangular wave and a sign wave of arbitrary frequency were generated by the function generator and their voltage waveforms were measured by the two data loggers at the same time. The measurement data was transmitted to a personal computer and was subjected to Wavelet transform by using a program coded by Visual Basic 2012. At this experiment, M was set to 16 and 16 measurement frequencies were set to 125 KHz, 62.5 KHz, 31.3 KHz, 15.6 KHz, 7.81 KHz, 3.91 KHz, 1.95 KHz, 977 Hz, 488 Hz, 244 Hz, 122 Hz, 61.0 Hz, 30.5 Hz, 15.3 Hz, 7.63 Hz, and 3.81 Hz.

Figure 8A:
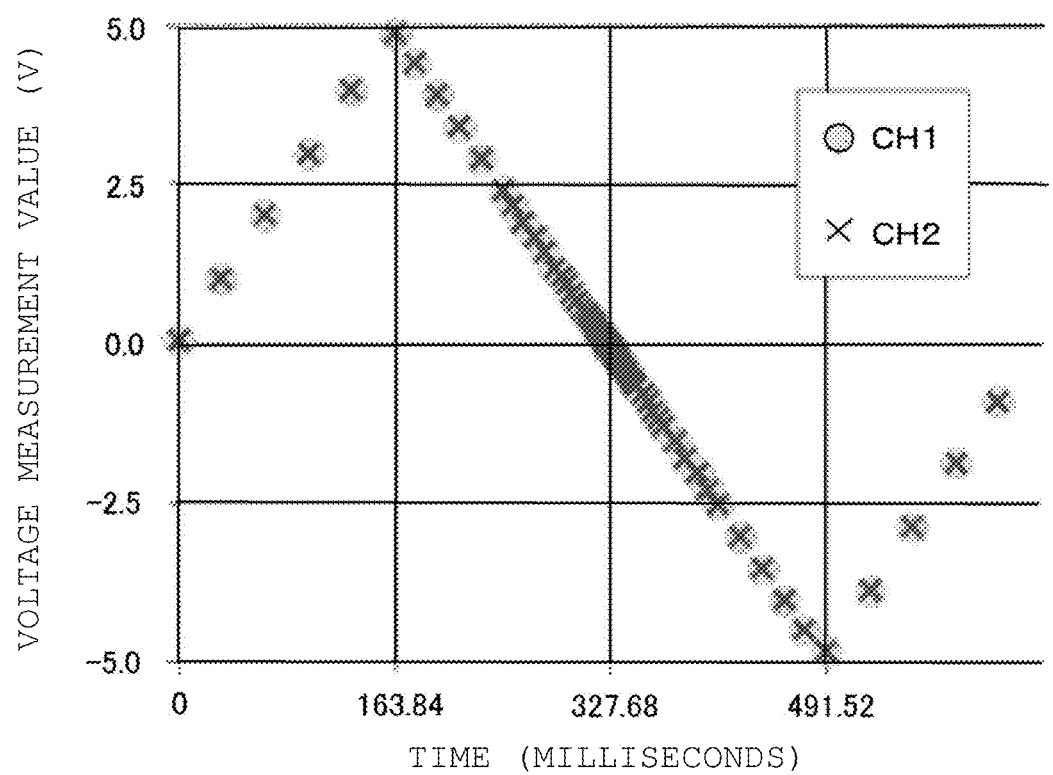
FIGS. 8A and 8B are diagrams illustrating the results of testing for validating the in-situ measurement method of an electrochemical impedance spectrum in the first example according to an embodiment of the present disclosure.
Figure 8B:
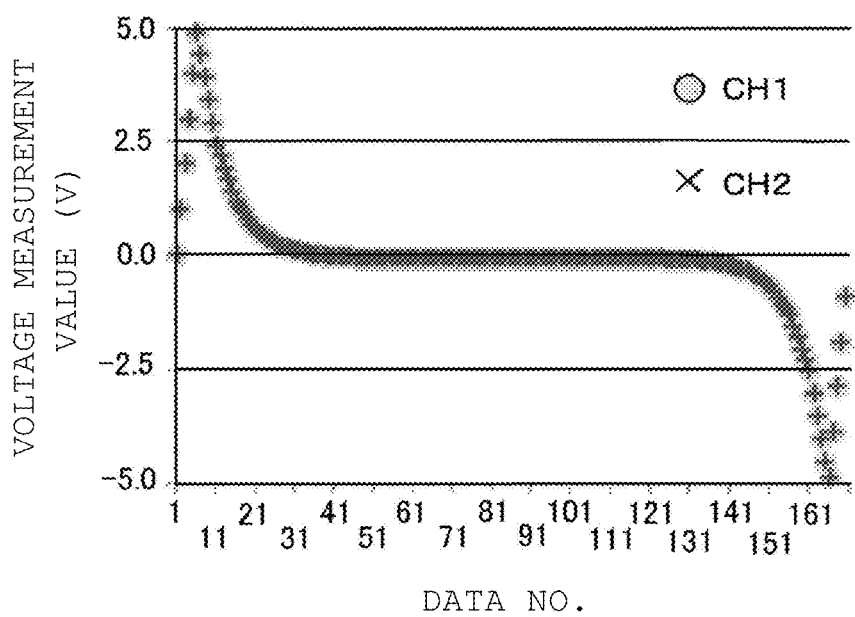

To make sure whether the data was acquired correctly as being set and whether the two data loggers were correctly synchronized with each other, first, a triangular wave signal with $V_{pp}=10$ V was input as an experiment. FIGS. 8A and 8B indicate the results of the experiment. FIG. 8A is a diagram provided by the oscilloscope. FIG. 8B is a diagram in which the acquired data is plotted with the lateral axis as time axis with data number. As seen from FIG. 8B, the measurement interval in the middle of the period was short and was long in the end parts of the period. That is, the data acquisition interval was not constant but reflected the intention of the test. Referring to FIG. 8B, the plots of "CH1" and "CH2" overlap completely. This means that the two data loggers were completely in synchronization with each other and acquired the data at the same timing.

Figure 9:
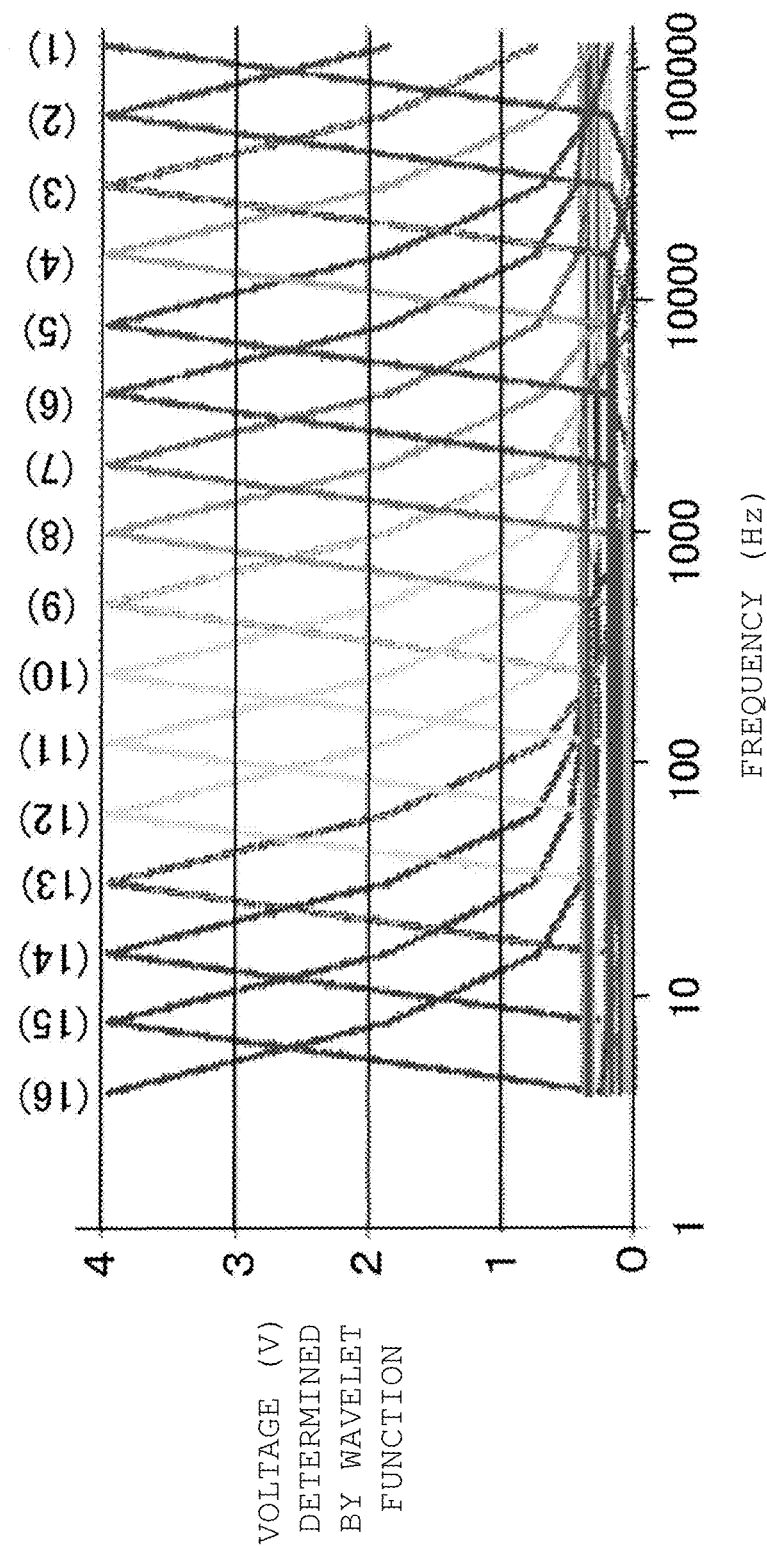
FIG. 9 is a diagram illustrating the results of testing for validating the in-situ measurement method of an electrochemical impedance spectrum in the first example according to an embodiment of the present disclosure.

In the in-situ measurement method of an electrochemical impedance spectrum in the first example, the measurement period of the charge current data and charge voltage data is 0.65536 seconds (=1 microsecond×655360 times), which means that 171 data are acquired in one measurement period. Then, the 171 data are subjected to Wavelet transform into complex impedances of 16 wavelengths. To verify whether the Wavelet transform is correctly performed, sign waves of 16 wavelengths from 125 KHz to 3.81 Hz ($V_{pp}=8$ V) were input in sequence for Wavelet transform as an experiment. FIG. 9 indicates the experimental results. As illustrated in FIG. 9, the acquisition of spectrum data with peaks only in the wavelengths of the input sign waves was verified. In FIG. 9, the figures parenthesized represent the degrees (first to 16th degrees).

The structure and configuration of the secondary battery 20 will be described below.

Specifically, the secondary battery 20 in the first example is formed from a cylindrical lithium-ion secondary battery. FIG. 3 is a schematic cross-sectional view of the cylindrical secondary battery 20 (lithium-ion secondary battery) in the first example. FIG. 4 is a schematic partial cross-sectional view of an electrode structure constituting the secondary battery in the first example along the longitudinal direction. FIG. 4 is a schematic partial cross-sectional view of a part of the electrode structure without the positive-electrode lead portion and the negative-electrode lead portion. In the drawing, the electrode structure is illustrated in flat form for the sake of simplicity. In actuality, however, the electrode structure is wound and thus curved.

In the secondary battery 20 in the first example, an electrode structure 21 and a pair of insulating plates 12 and 13 are stored in an almost hollow columnar electrode structure storage member 11. The electrode structure 21 can be produced, for example, by laminating the positive-electrode member 22 and the negative-electrode member 24 with the separator 26 interposed therebetween to obtain the electrode stricture and then winding the electrode structure.

The electrode structure storage member (battery can) 11 has a hollow structure in which one end is closed and the other end is opened, and is formed from iron (Fe), aluminum (Al), and others. The surface of the electrode structure storage member 11 may be plated with nickel (Ni) or the like. The pair of insulating plates 12 and 13 are arranged to sandwich the electrode structure 21 therebetween and extend vertically to the winding peripheral surface of the electrode structure 21. A cell lid 14, a safety valve mechanism 15, and a positive temperature coefficient (PTC) element 16 are crimped via a gasket 17 to the open end of the electrode structure storage member 11. Accordingly, the electrode structure storage member 11 is sealed. The cell lid 14 is made from the same material as that for the electrode structure storage member 11, for example. The safety valve mechanism 15 and the positive temperature coefficient element 16 are provided inside the cell lid 14, and the safety valve mechanism 15 is electrically connected to the cell lid 14 via the positive temperature coefficient element 16. In the safety valve mechanism 15, when the internal pressure reaches a certain value or more due to internal short-circuit or heating from the outside, a disc plate 15A is reversed. Accordingly, the cell lid 14 and the electrode structure 21 are electrically disconnected. To prevent abnormal heat generation resulting from a large current, the resistance of the positive temperature coefficient element 16 increases with temperature rise. The gasket 17 is produced from an insulating material, for example. The surface of the gasket 17 may be coated with asphalt or the like.

A center pin 18 is inserted into the winding center of the electrode structure 21. However, the center pin 18 may not be inserted into the winding center. The positive-electrode member 22 is connected to the positive-electrode lead portion 23 made from an electrical conductive material such as aluminum. Specifically, the positive-electrode lead portion 23 is attached to a positive-electrode current collector 22A. The negative-electrode member 24 is connected to a negative-electrode lead portion 25 made from an electrically conductive material such as copper. Specifically, the negative-electrode lead portion 25 is attached to a negative-electrode current collector 24A. The negative-electrode lead portion 25 is welded to the electrode structure storage member 11 and is electrically connected to the electrode structure storage member 11. The positive-electrode lead portion 23 is welded to the safety valve mechanism 15 and is electrically connected to the cell lid 14. In the example illustrated in FIG. 3, the negative-electrode lead portion 25 is provided in one place (the outermost peripheral section of the wound electrode structure). However, the negative-electrode lead portion 25 may be provided in two places (the outermost peripheral portion and the innermost peripheral portion of the wound electrode structure).

The electrode structure 21 is formed by laminating the positive-electrode member 22 with the positive-electrode active material layer 22B on the positive-electrode current collector 22A (specifically, on the both sides of the positive-electrode current collector 22A) and the negative-electrode member 24 with the negative-electrode active material layer 24B on the negative-electrode current collector 24A (specifically, on the both sides of the negative-electrode current collector 24A) with the separator 26 interposed therebetween. The positive-electrode active material layer 22B is not formed on the region of the positive-electrode current collector 22A to which the positive-electrode lead portion 23 is to be attached, and the negative-electrode active material layer 24B is not formed on the region of the negative-electrode active material layer 24A to which the negative-electrode lead portion 25 is to be attached.

Table 2 below indicates the specifications of the secondary battery 20 in the first example.

TABLE 2

| | |
|---|---|
| The positive-electrode current collector 22A | 20 μm-thick aluminum foil |
| The positive-electrode active material layer 22B | 50 μm thick on one side |
| The positive-electrode lead portion 23 | 100 μm-thick aluminum (Al) foil |

TABLE 2-continued

| | |
|---|---|
| The negative-electrode current collector 24A | 20 μm-thick copper foil |
| The negative-electrode active material layer 24B | 50 μm thick on one side |
| The negative-electrode lead section 25 | 100 μm-thick nickel (Ni) foil |

To produce the positive-electrode member 22, first, 91 pts. mass of a positive-electrode active material ($LiCoO_2$), 3 pts. mass of a positive-electrode binding agent (polyvinylidene fluoride), and 6 pts. mass of a positive-electrode conducting agent (black lead or graphite) are mixed to form a positive-electrode mixture. The positive-electrode mixture is mixed with an organic solvent (N-methyl-2-pyrrolidone) into a paste-like positive-electrode mixture slurry. Then, the positive-electrode mixture slurry is applied to the both sides of the belt-like positive-electrode current collector 22A (20 μm-thick aluminum foil) by a coating device and dried to form the positive-electrode active material layer 22B. The positive-electrode active material layer 22B is compressed and molded by a roll press machine.

To produce the negative-electrode member 24, first, 97 pts. mass of a negative-electrode active material (black lead (graphite) or a mixed material of black lead and silicon) and 3 pts. mass of a negative-electrode binding agent (polyvinylidene fluoride) are mixed to form a negative-electrode mixture. The average grain diameter $d_{50}$ of the black lead is 20 μm. Then, the negative electrode is mixed with an organic solvent (N-methyl-2-pyrrolidone) into a paste-like negative-electrode mixture slurry. Then, the negative-electrode mixture slurry is applied to the both sides of the belt-like negative-electrode current collector 24A (20 μm-thick copper foil) by a coating device and dried to form the negative-electrode active material layer 24B. The negative-electrode active material layer 24B is compressed and molded by a roll press machine.

The separator 26 is formed from a 20 μm-thick microporous polyethylene film. The electrode structure 21 is impregnated with a non-aqueous electrolyte solution of the composition shown in Table 3 or 4 below. The solvent of the non-aqueous electrolyte solution indicates a wide-range concept that includes not only liquid materials but also ion-conductive materials capable of dissociating electrolyte salt. Therefore, in the case of using an ion-conductive polymer compound, the polymer compound is also included in the solvent.

TABLE 3

| | |
|---|---|
| Organic solvent: | EC/PC a mass ratio of 1/1 |
| Lithium salt constituting a non-aqueous electrolyte solution: | $LiPF_6$ 1.0 mol/litter |

TABLE 4

| | |
|---|---|
| Organic solvent: | EC/DMC a mass ratio of 3/5 |
| Lithium salt constituting a non-aqueous electrolyte solution: | $LiPF_6$ 1.0 mol/litter |

To prepare a non-aqueous electrolyte solution, a first compound, a second compound, a third compound, and other materials are mixed and stirred. As the first compound, bisfluorosulfonylimide lithium (LiFSI) or bistrifluoro metyl-sulfonylimide lithium (LiTFSI) is used. As the second compound, acetonitrile (AN), propionitrile (PN), or butyronitrile (BN) as a non-oxygen-containing mono-nitrile compound or methoxy acetonitrile (MAN) as an oxygen-containing mono-nitrile compound is used. As the third compound, vinylene carbonate (VC), vinyl ethylene carbonate (VEC), or methylene ethylene carbonate (MEC) as an unsaturated cyclic carbonate, or 4-fluoro-1,3-dioxolan-2-one (FEC) or carbonic acid bis(fluoromethyl) (DFDMC) as a halogenated carbonate, or succinonitrile (SN) as a polynitrile compound is used. As the other materials, ethylene carbonate (EC) as a cyclic carbonate, dimethyl carbonate (DMC) as a chain carbonate, hexafluoride lithium phosphate ($LiPF_6$) and lithium tetrafluoroborate ($LiBF_4$) as electrolyte salts are used. However, the electrolyte solution is not limited to the foregoing composition.

The secondary battery 20 can be produced by the following procedure, for example.

That is, first, as described above, the positive-electrode active material layer 22B is formed on the both sides of the positive-electrode current collector 22A, and the negative-electrode active material layer 24B is formed on the both sides of the negative-electrode current collector 24A.

After that, the positive-electrode lead portion 23 is attached to the positive-electrode current collector 22A by a welding method or the like. The negative-electrode lead portion 25 is attached to the negative-electrode current collector 24A by a welding method or the like. Next, the positive-electrode member 22 and the negative-electrode member 24 are laminated with the separator 26 formed from a 20 μm-thick microporous polyethylene film interposed therebetween and the laminated members are wound (more specifically, the electrode structure (laminated structure) of the positive-electrode member 22/the separator 26/the negative-electrode member 24/the separator 26 to produce the electrode structure 21, and then a protective tape (not illustrated) is attached to the outermost peripheral portion. After that, the center pin 18 is inserted into the center of the electrode structure 21. Then, the electrode structure 21 is sandwiched in the pair of insulating plates 12 and 13, and stored in the electrode structure storage member (battery can) 11. In this case, the tip of the positive-electrode lead portion 23 is attached to the safety valve mechanism 15 and the tip of the negative-electrode lead portion 25 is attached to the electrode structure storage member 11 by a welding method or the like. After that, an organic electrolyte solution or a non-aqueous electrolyte solution is put in a reduced-pressure manner to impregnate the separator 26 with the organic electrolyte solution or the non-aqueous electrolyte solution. Then, the cell lid 14, the safety valve mechanism 15, and the positive temperature coefficient element 16 are crimped to the open end of the electrode structure storage member 11 via the gasket 17.

The lithium-ion secondary battery in the example operates as described below, for example. That is, at the time of charging, when the positive-electrode member 22 releases lithium ions, the lithium ions are occluded in the negative-electrode member 24 via the non-aqueous electrolyte solution. On the other hand, at the time of discharging, when the negative-electrode member 24 releases lithium ions, the lithium ions are occluded in the positive-electrode member 22 via the non-aqueous electrolyte solution. The lithium-ion secondary battery is designed such that the open circuit voltage (battery voltage) in the fully charged state becomes $V_N$ V, for example. In this case, as compared to the case where the lithium-ion secondary battery is designed such that the open circuit voltage in the fully charged state becomes 4.2 V, the release amount of lithium per unit mass is large. In this way, adjusting the amount of the positive-electrode active material and the amount of the negative-electrode active material and designing the lithium-ion secondary battery such that the open circuit voltage (battery voltage) in the fully charged state becomes a predetermined voltage (upper limit voltage) makes it possible to obtain a high energy density.

In the secondary battery charging apparatus, the temperature information acquisition device, and the charging method of a secondary battery in the first example, during the charging of the secondary battery, the plural pieces of charge current data and charge voltage data are collected in a time series and the internal temperature of the secondary battery is acquired based on the plural pieces of collected charge current data and charge voltage data. Accordingly, the internal temperature of the secondary battery can be accurately acquired. As a result, it is possible to charge the secondary battery under the optimum conditions, suppress the occurrence of a deterioration mode involved in temperature, and provide the secondary battery with long-term reliability and excellent long-term charge/discharge cycle characteristics. According to the in-situ measurement method of an electrochemical impedance spectrum in the first example, the charge current data and the charge voltage data are determined only at the unit time $t_p$ represented by Equation (A). This decreases the numbers of charge current data and charge voltage data to be acquired to the minimum. Accordingly, it is possible to shorten the time for data processing, reduce the load on the temperature information acquisition device, and acquire the accurate internal temperature of the secondary battery.

Figure 10:
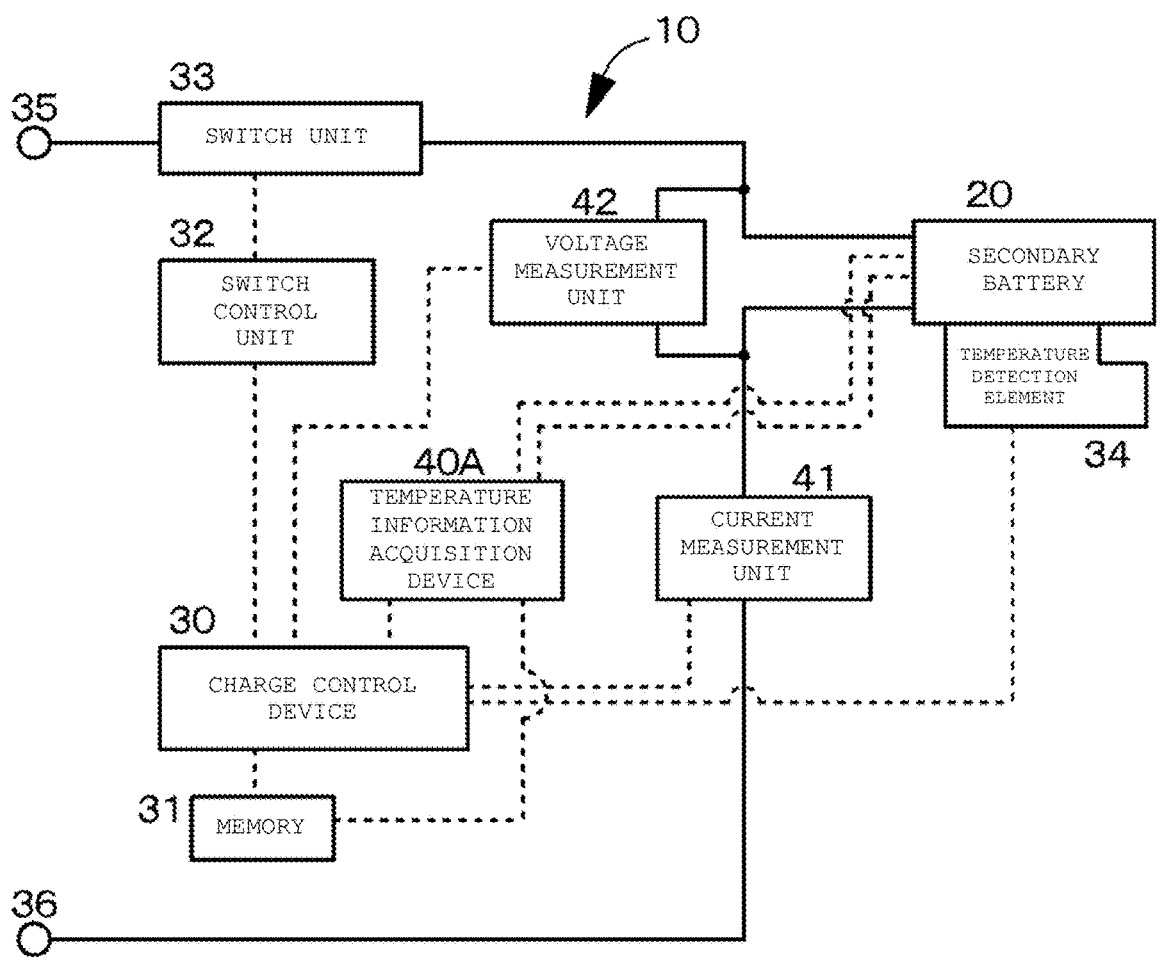
FIG. 10 is a conceptual view of a secondary battery charging apparatus and a temperature information acquisition device in a second example according to an embodiment of the present disclosure.

A second example relates to a secondary battery charging apparatus according to an embodiment of the present disclosure, a temperature information acquisition device according to the second aspect of the present disclosure, and a charging method of a secondary battery according to the second aspect of the present disclosure. The flow of the charging method of a secondary battery in the second example is the same as illustrated in FIG. 1. FIG. 10 is a conceptual diagram of the secondary battery charging apparatus and the temperature information acquisition device in the second example.

The secondary battery 20 in the second example has the positive-electrode member 22, the negative-electrode member 24, the separator 26, and the electrolyte layer 28. The positive-electrode member 22, the separator 26, and the negative-electrode member 24 form the wound electrode structure 21. A first lead portion and a second lead portion are attached to one end and the other end of any one of the positive-electrode member 22 and the negative-electrode member 24 constituting the wound electrode structure 21. Specifically, the negative-electrode first lead portion is attached to the one end of the negative-electrode member 24, and the negative-electrode second lead portion is attached to the other end of the negative-electrode member 24. That is, the negative-electrode lead portions are provided at the two places of the wound electrode structure (the outermost peripheral portion and the innermost peripheral portion of the wound electrode structure). For example, the negative-electrode first lead portion is welded to the electrode structure storage member 11 and electrically connected to the electrode structure storage member 11. The negative-electrode second lead portion is connected to a measurement terminal (not illustrated) in the secondary battery 20.

The secondary battery charging apparatus in the second example includes the charge control device 30 that controls charge current for charging the secondary battery 20 in the second example and a temperature information acquisition device 40A that acquires the internal temperature $Tp_{cell}$ of the secondary battery 20. The charge control device 30 in the second example can be substantially configured and structured in the same manner as the charge control device 30 described above in relation to the first example. During charging of the secondary battery, the temperature information acquisition device 40A determines the internal resistance value of the secondary battery 20 from an alternating-current impedance measurement value determined by flowing alternating-current between the first lead portion and the second lead portion, and acquires the internal temperature $Tp_{cell}$ of the secondary battery 20 from the internal resistance value. The charge control device 30 charges the secondary battery 20 while controlling the charge current for charging the secondary battery 20 such that the internal temperature $Tp_{cell}$ of the secondary battery 20 falls within a predetermined temperature range acquired by the temperature information acquisition device 40A. In addition, during the charging of the secondary battery, the temperature information acquisition device 40A in the second example determines the internal resistance value of the secondary battery 20 from an alternating-current impedance measurement value determined by flowing alternating-current between the first lead portion and the second lead portion, and acquires the internal temperature $Tp_{cell}$ of the secondary battery 20 from the internal resistance value. Flowing alternating current between the first lead portion and the second lead portion makes it possible to determine an alternating-current impedance based on the skin effect.

The internal resistance value of the secondary battery 20 has strong temperature dependency. Therefore, determining the internal resistance value makes it possible to acquire the internal temperature $Tp_{cell}$ of the secondary battery 20 from the internal resistance value. The relationship among the alternating-current impedance measurement value, the internal resistance value, and the internal temperature $Tp_{cell}$ of the secondary battery 20 is determined in advance by conducting various tests and stored in advance in the storage medium (the memory 31) in the temperature information acquisition device 40A.

The frequency of the alternating current flown between the negative-electrode first lead portion and the negative-electrode second lead portion can be $1 \times 10^{-2}$ to $1 \times 10^5$ Hz inclusive, specifically, $1 \times 10^3$ Hz as an example. The peak current value can be 5 to 20 mA inclusive, specifically, 10 mA as an example. However, the frequency and the peak current are not limited to these values.

The temperature information acquisition device 40A in the second embodiment includes a known alternating-current generation unit that generates the alternating current specified as above, a known alternating-current impedance measurement unit, and the memory 31.

In the example 2, during the charging of the secondary battery, the alternating current is flown between the negative-electrode first lead portion and the negative-electrode second lead portion once every 60 seconds, for example, to determine the alternating-current impedance measurement value by a known method. Then, the internal resistance value of the secondary battery 20 is determined from the determined alternating-current impedance measurement value and the internal temperature $Tp_{cell}$ of the secondary battery 20 is acquired from the internal resistance value as described above. Then, the secondary battery 20 is charged while the charge current is controlled such that the acquired internal temperature $Tp_{cell}$ of the secondary battery 20 falls within a predetermined temperature range. The flow of the charging method of a secondary battery in the second example is substantially the same as that in the first example.

In the secondary charging apparatus, the temperature information acquisition device, and the charging method of a secondary battery in the second example, during the charging of the secondary battery, the internal resistance value of the secondary battery is determined from the alternating-current impedance measurement value determined by flowing alternating current between the first lead portion and the second lead portion. Accordingly, the internal temperature of the secondary battery can be accurately acquired. As a result, it is possible to charge the secondary battery under the optimum conditions, suppress the occurrence of a deterioration mode involved in temperature, and provide the secondary battery with long-term reliability and excellent long-term charge/discharge cycle characteristics.

Third Example

Figure 11:
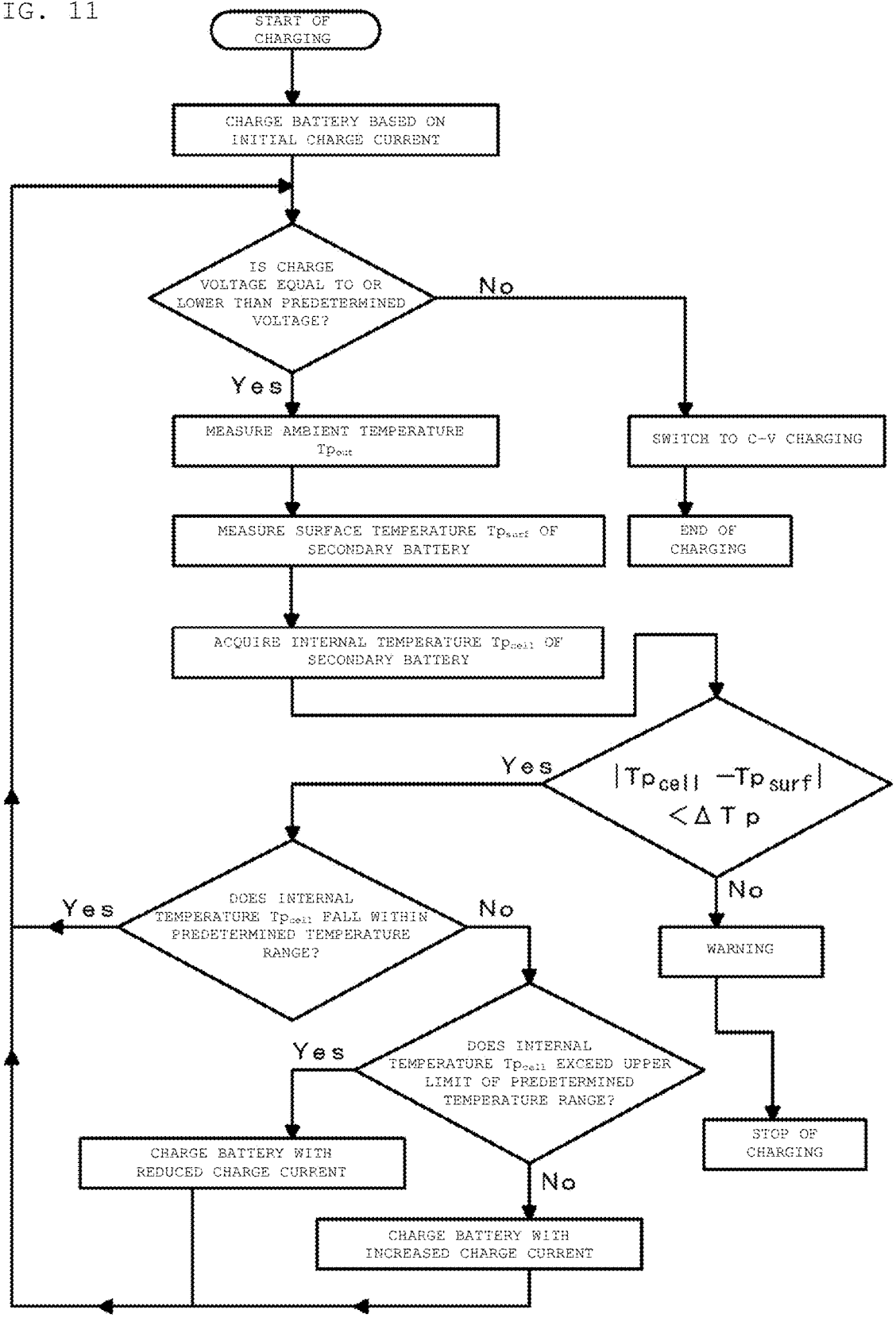
FIG. 11 is a flowchart for describing a charging method of a secondary battery in a third example according to an embodiment of the present disclosure.

A third example is a modification of the first and second examples. FIG. 11 is a flowchart for describing a charging method of a secondary battery in the third example. In the third example, a surface temperature $Tp_{surf}$ of the secondary battery 20 is measured, an internal temperature $Tp_{esti}$ of the secondary battery 20 is estimated from the measurement result of the surface temperature $Tp_{surf}$. When the difference between the estimated internal temperature $Tp_{esti}$ of the secondary battery 20 and the acquired internal temperature $Tp_{cell}$ of the secondary battery exceeds a predetermined temperature difference $\Delta Tp$, the fact is notified. Specifically, as described above, the temperature detection element 34 formed from a thermistor is attached to the outer surface of the secondary battery 20 and is connected to the charge control device 30. $Tp_{esti}$ can be determined from Equation (C) below. The predetermined temperature difference $\Delta Tp$ can be 0.1 to 1° C. inclusive, specifically, 0.5° C. as an example. Accordingly, when any abnormality occurs in the surface temperature $Tp_{surf}$ and its measurement or the internal temperature $Tp_{esti}$ of the secondary battery 20 and its acquisition, the abnormality can be easily detected. When not only the surface temperature of the secondary battery but also other temperatures such as an outside temperature $Tp_{out}$ can be referred to, a thermal resistance network can be assumed for analysis.

$$Tp_{esti}=Tp_{surf}+R_{th} \times PW \qquad (C)$$

where $R_{th}$: Thermal resistance between the electrode and the secondary battery that is calculated from the temperature gradient measured by a thermo-viewer as described above.

PW: Input power that is determined from $P=R_{int} \times I^2$.

$R_{int}$: Internal resistance value of the secondary battery (direct-current resistance component).

I: Average value of the charge current for the previous ten seconds

Figure 12:
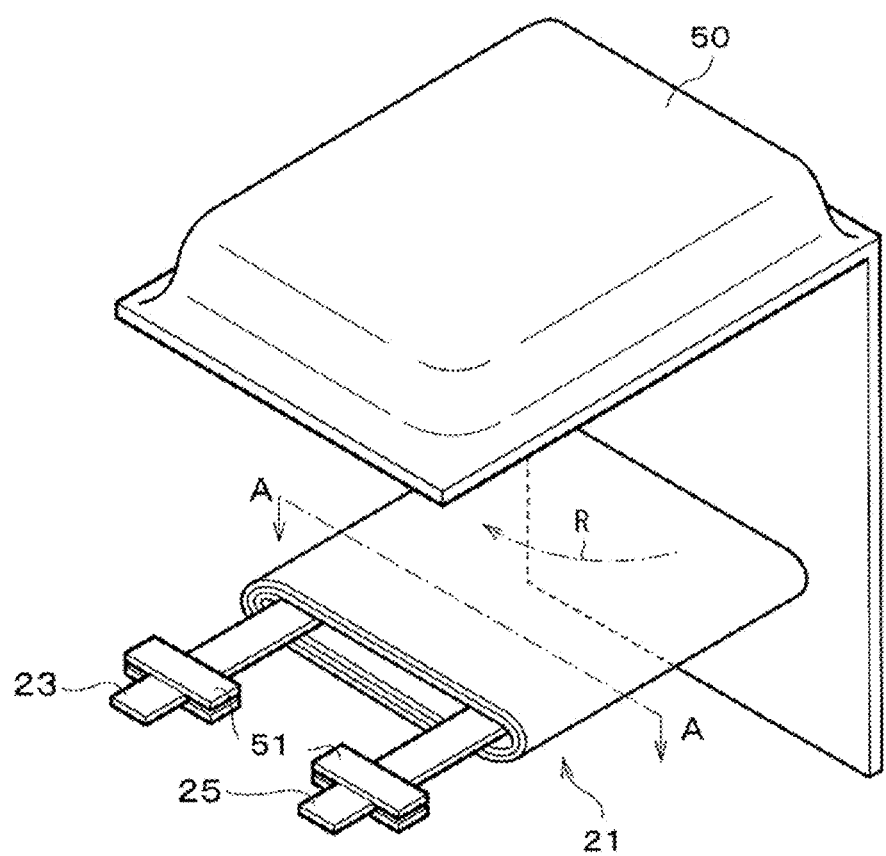
FIG. 12 is a schematic exploded perspective view of a laminated film-type square secondary battery (lithium-ion secondary battery) in a fourth example according to an embodiment of the present disclosure.
Figure 13A:
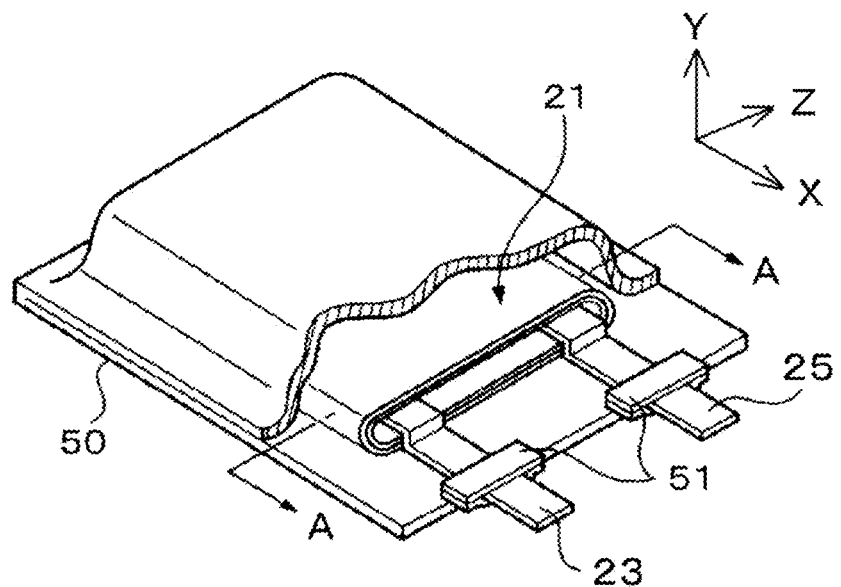
FIG. 13A is a schematic exploded perspective view of the laminated film-type secondary battery (lithium-ion secondary battery) in the fourth example in a state different from that in FIG. 12.
Figure 13B:
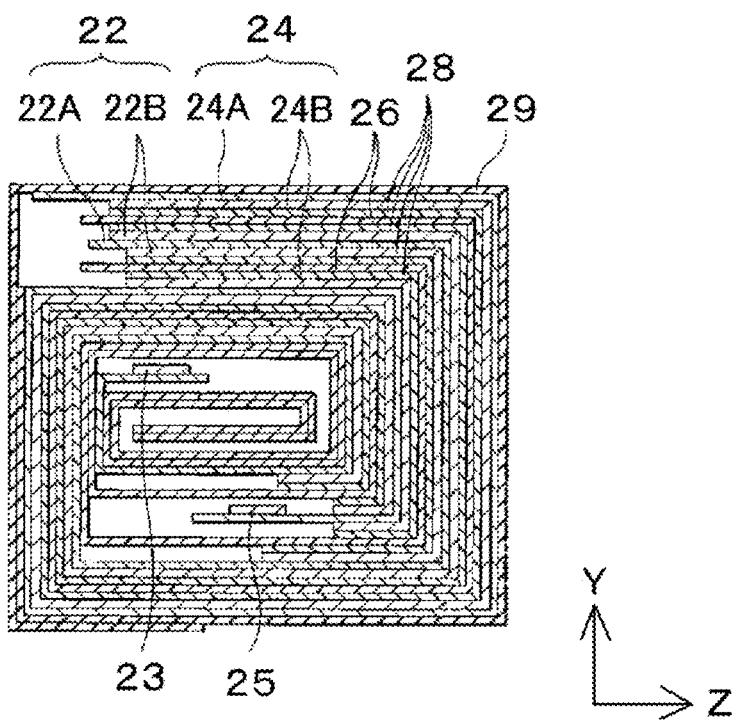
FIG. 13B is a schematic cross-sectional view of an electrode structure in the laminated film-type secondary battery (lithium-ion secondary battery) in the fourth example taken along arrows A-A illustrated in FIGS. 12 and 13A.

A fourth example is a modification of the first to third examples, which is formed from a flat plate-type laminated-film lithium-ion secondary battery in which a positive-electrode member, a separator, and a negative-electrode member are wound. FIGS. 12 and 13A are schematic exploded perspective views of the secondary battery in the fourth example, and FIG. 13B is a schematic enlarged cross-sectional view of an electrode structure (laminated structure) illustrated in FIG. 13A along arrow AA (schematic enlarged cross-sectional view along a YZ plane). The schematic partial enlarged cross-sectional view of the electrode structure illustrated in FIG. 13B (schematic partial cross-sectional view along an XY plane) is the same as that illustrated in FIG. 4.

In the secondary battery in the fourth example, the electrode structure 21 basically similar to that in the first example is stored in the exterior member 50 formed from a laminated film. The electrode structure 21 can be produced by laminating the positive-electrode member 22 and the negative-electrode member 24 via the separator 26 and the electrolyte layer 28 and winding the laminated structure. The positive-electrode lead portion 23 is attached to the positive-electrode member 22 and the negative-electrode lead portion 25 is attached to the negative-electrode member 24. The outermost peripheral portion of the electrode structure 21 is protected by a protective tape 29.

The positive-electrode lead portion 23 and the negative-electrode lead portion 25 extend in the same direction from the inside to outside of the exterior member 50. The positive-electrode lead portion 23 is formed from an electrically conductive material such as aluminum. The negative-electrode lead portion 25 is formed from electrically conductive materials such as copper, nickel, and stainless steel. These electrically conductive materials are thin plate-like or net-like, for example.

The exterior member 50 is a single film that is foldable in the direction of arrow R illustrated in FIG. 12 and has a partial recess (embossed portion) for storing the electrode structure 21. The exterior member 50 is a laminated film in which a fusion layer, a metallic layer, and a surface protective layer are laminated in this order, for example. In the production process of a lithium-ion secondary battery, the exterior member 50 is folded such that the folded portions of the fusion layer are opposed to each other with the electrode structure 21 interposed therebetween, and then the outer edges of the fusion layer are fused. However, the exterior member 50 may be formed by bonding two laminated films with an adhesive or the like. The fusion layer is formed from a film of polyethylene, polypropylene, or the like, for example. The metallic layer is formed from aluminum foil, or the like, for example. The surface protective layer is formed from nylon, polyethylene terephthalate, for example. Among them, the exterior member 50 is preferably an aluminum laminated film in which a polyethylene film, aluminum foil, and a nylon film are laminated in this order. However, the exterior member 50 may be a laminated film of another laminated structure or a polymer film of polypropylene, or a metallic film. Specifically, the exterior member 50 is formed from a moisture-resistance aluminum laminated film (100 µm thick in total) in which a nylon film (30 µm thick), aluminum foil (40 µm thick), and a non-oriented polypropylene film (30 µm thick) are laminated in this order from the outside.

To prevent the entry of outside air, an adhesive film 51 is inserted between the exterior member 50 and the positive-electrode lead portion 23 and between the exterior member 50 and the negative-electrode lead portion 25. The adhesive film 51 is formed from a material adherent to the positive-electrode lead portion 23 and the negative-electrode lead portion 25, for example, a polyolefin resin, more specifically, a polyolefin resin such as polyethylene, polypropylene, modified polyethylene, or modified polypropylene.

As illustrated in FIG. 13B, the positive-electrode member 22 has a positive-electrode active material layer 22B on one or both sides of the positive-electrode current collector 22A. The negative-electrode member 24 has a negative-electrode active material layer 24B on one or both sides of the negative-electrode current collector 24A.

In relation to a fifth example, an application example of the present disclosure will be described.

The secondary battery charging apparatuses, the temperature information acquisition devices, the charging methods of a secondary battery, and the in-situ measurement method of an electrochemical impedance spectrum according to the first and second aspects of the present disclosure described above in relation to the first to fourth examples can be applied to machinery, devices, instruments, apparatuses, and systems (assemblies of plural devices or the like) in which the secondary battery is usable as a driving and operating power source or a power source for power storage with no particular limitation. A secondary battery (specifically, a lithium-ion secondary battery) used as a power source may be a main power source (to be used on a priority basis) or an auxiliary power source (to be used instead of the main power source or switched from the main power source). In the case of a lithium-ion secondary battery as an auxiliary power source, the main power source is not limited to a lithium-ion secondary battery.

Examples of use applications of the secondary battery in the present disclosure (specifically, a lithium-ion secondary battery) include, but not limited to, various electronic devices and electric devices (including mobile electronic devices) such as video cameras, cam coders, digital still cameras, cell phones, personal computers, televisions, various display devices, cordless phones, headphone stereos, music players, mobile radios, electronic papers such as electronic books and electronic newspapers, mobile information terminals such as PDAs, toys, mobile living instruments such as electric shavers, lighting equipment such as room lamps, medical electronic devices such as pace makers and hearing aid, storage devices such as memory cards, battery packs used as detachable power sources for use in personal computers and the like, electric tools such as electric drills and sawing machines, power storage systems and home energy servers such as domestic battery systems for power storage for emergencies (domestic power storage devices), power supply systems, power storage units and backup power sources, electric cars, electric motorcycles, electric bicycles, electric vehicles such as Segway (registered trademark), electric driving force transducers for aircrafts and ships (specifically, power motors, for example).

Among them, the secondary battery in the present disclosure (specifically, the lithium-ion secondary battery) is effectively applied to battery packs, electric vehicles, power storage systems, power supply systems, electric tools, electronic devices, electric devices, and the like. Due to the requirement for excellent battery characteristics, applying the present disclosure to a lithium-ion secondary battery makes it possible to improve performance in an effective manner. The battery pack is a power source using a lithium-ion secondary battery, so-called assembled battery. The electric vehicle is a vehicle that operates (runs) with a lithium-ion secondary battery as a driving power source, and may be an automobile including a driving source other than the secondary battery (hybrid vehicle or the like). The power storage system (power supply system) is a system in which the lithium-ion secondary battery is used as a power storage source. For example, in the domestic power storage system (power supply system), electric power is stored in the lithium-ion secondary battery as a power storage source, and thus the electric power can be utilized to use home appliances. The electric tool is a tool that has a movable portion (for example, a drill or the like) moved with the lithium-ion secondary battery as a driving source. The electronic device and the electric device are devices that perform various functions with the lithium-ion secondary battery as an operating power source (electric power source).

Some specific application examples of the lithium-ion secondary battery will be described below. Configurations of the application examples described below are mere examples and can be changed as appropriate.

The battery pack is a simplified battery pack (soft pack) with one lithium-ion secondary battery, which is loaded in an electronic device typified by a smartphone, for example. Otherwise, the battery pack includes an assembled battery formed from six lithium-ion secondary batteries connected in a two-parallel and three-series manner. The connection mode of the lithium-ion secondary batteries may be serial or parallel or mixture of them.

Figure 14:
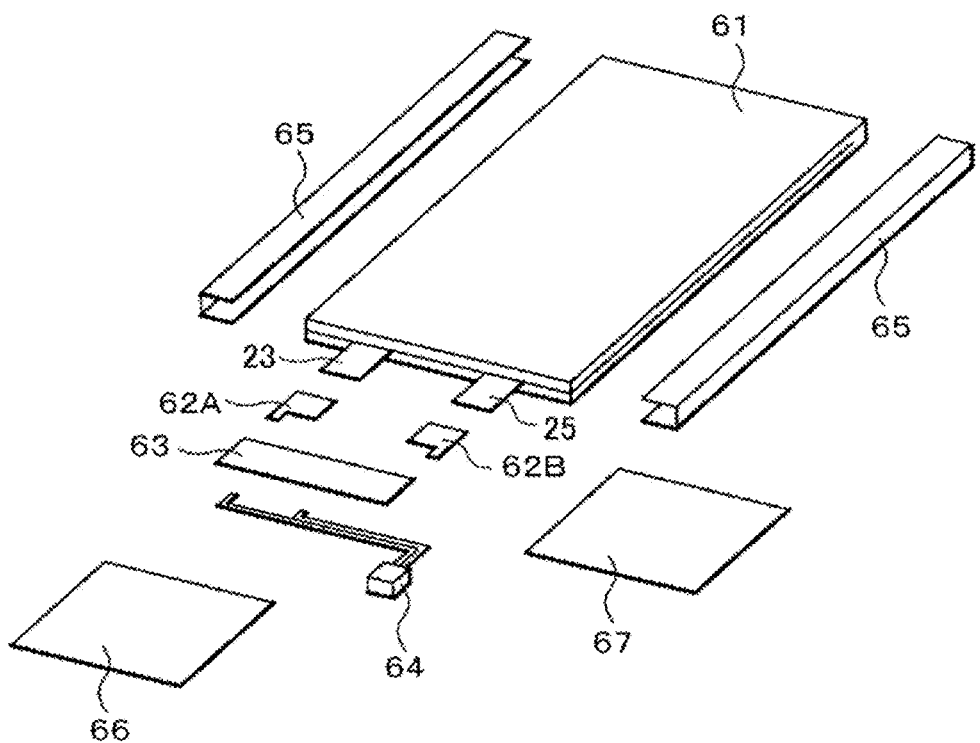
FIG. 14 is a schematic exploded perspective view of an application example (battery pack: single cell) in which the first to fourth examples of the present disclosure are applied to a secondary battery (lithium-ion secondary battery) according to an embodiment of the present disclosure.

FIG. 14 is a schematic exploded perspective view of a battery pack using a single cell. The battery pack is a simplified battery pack (soft pack) with one lithium-ion secondary battery, which is loaded in an electronic device typified by a smartphone, for example. The battery pack includes a power source 61 formed from the lithium-ion secondary battery described above in relation to the first example and the fourth example (the fourth example illustrated in the drawing) and a circuit board 63 connected to the power source 61. The positive-electrode lead portion 23 and the negative-electrode lead portion 25 are attached to the power source 61.

A pair of adhesive tapes 65 are attached to the both sides of the power source 61. The circuit board 63 has a protection circuit module (PCM). The circuit board 63 is connected to the positive-electrode lead portion 23 via a tab 62A and is connected to the negative-electrode lead portion 25 via a tab 62B. The circuit board 63 also has a connector-equipped lead wire 64 with a connector for external connection. In the state where the circuit board 63 is connected to the power source 61, the circuit board 63 is protected from top and bottom by a label 66 and an insulation sheet 67. The circuit board 63 and the insulation sheet 67 are fixed together by attaching the label 66. The circuit board 63 has the secondary battery charging apparatus 10 described above in relation to the first to third examples. In some cases, a power management integrated circuit implemented in a smartphone can also act as the secondary battery charging apparatus 10 described above in relation to the first to third examples. That is, the power management integrated circuit can be operated by software that can act as the secondary battery charging apparatus 10 described above in relation to the first to third examples.

Figure 15A:
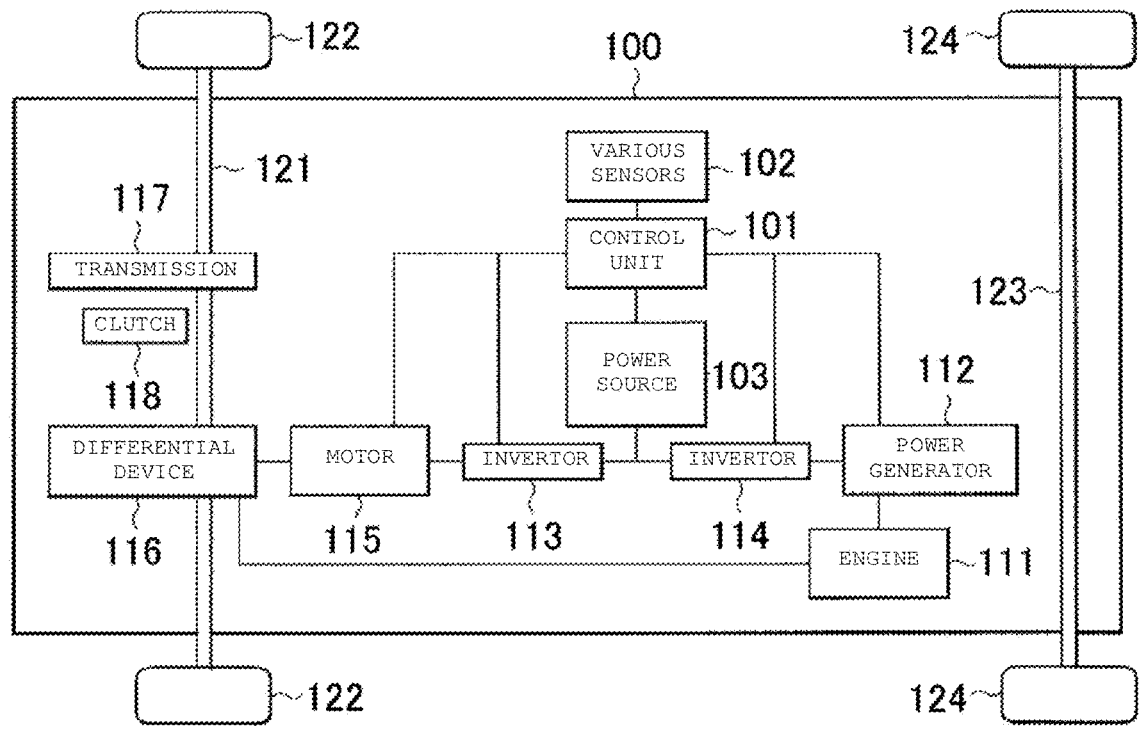
FIGS. 15A, 15B, and 15C are respectively a block diagram of a configuration of an application example (electric vehicle) in a fifth example of the present disclosure, a block diagram of a configuration of an application example (power storage system) in the fifth example of the present disclosure, and a block diagram of a configuration of an application example (electric tool) in the fifth example of the present disclosure.

Next, FIG. 15A is a block diagram illustrating a configuration of an electric vehicle such as a hybrid vehicle as an example. The electric vehicle includes, for example, a control unit 101, various sensors 102, a power source 103, an engine 111, a power generator 112, invertors 113 and 114, a driving motor 115, a differential device 116, a transmission 117, and a clutch 118 in a metallic casing 100. Besides, the electric vehicle includes a front-wheel drive shaft 121, front wheels 122, a rear-wheel drive shaft 123, and rear wheels 124 connected to the differential device 116 and the transmission 117.

The electric vehicle can run with either the engine 111 or the motor 115 as a driving source, for example. The engine 111 is a main power source, for example, a gasoline engine or the like. In the case of using the engine 111 as a power source, the driving force (rotational force) of the engine 111 is transferred to the front wheels 122 or the rear wheels 124 via the differential device 116, the transmission 117, and the clutch 118 as a driving unit, for example. The rotational force of the engine 111 is also transferred to the power generator 112. The power generator 112 uses the rotational force to generate alternating current. The alternating current is converted into direct-current power via the invertor 114 and accumulated in the power source 103. In the case of using the motor 115 that is a conversion unit as a power source, the power supplied from the power source 103 (direct-current power) is converted into alternating-current power via the invertor 113. The alternating-current power is used to drive the motor 115. The driving force converted from electric power by the motor 115 is transferred to the front wheels 122 or the rear wheels 124 via the electrode structure storage member 116 as a driving unit, the transmission 117, and the clutch 118.

When the electric vehicle is decelerated via a braking mechanism not illustrated, resistive force at the time of deceleration is transferred as rotational force to the motor 115. The rotational force may be used to cause the motor 115 to generate alternating-current power. The alternating-current power is converted into direct-current power via the invertor 113. The direct-current regenerative power is accumulated in the power source 103.

The control unit 101 controls the entire operation of the electric vehicle and includes a CPU and the like, for example. The control unit 101 also includes the secondary battery charging apparatus 10 described above in relation to the first to third examples. The power source 103 includes one or two or more lithium-ion secondary batteries (not illustrated) described above in relation to the first to fourth examples. The power source 103 may be connected to an external power source to receive power supplied from the external power source and accumulate the power. The various sensors 102 are used to control the number of rotations of the engine 111 and the opening of the throttle valve not illustrated (throttle opening), for example. The various sensors 102 include, for example, a velocity sensor, an acceleration sensor, an engine rotation number sensor, and others.

The case where the electric vehicle is a hybrid vehicle has been described so far. The electric vehicle may be a vehicle that is operated by only the power source 103 and the motor 115 without the use of the engine 111 (electric car).

Figure 15B:
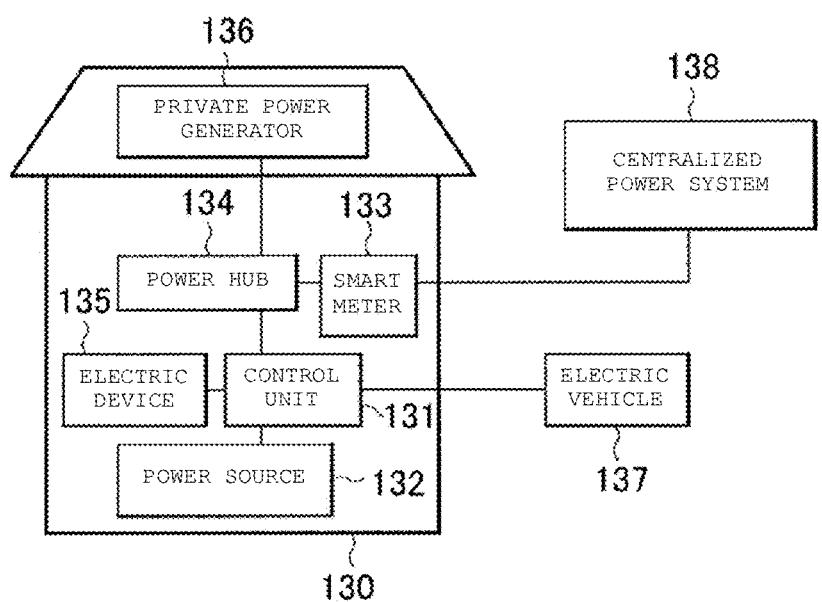

FIG. 15B is a block diagram of a configuration of a power storage system (power supply system). The power storage system includes, for example, a control unit 131, a power source 132, a smart meter 133, and a power hub 134 in a building 130 such as a conventional home or a commercial building.

The power source 132 is connected to an electric device (electronic device) 135 installed in the building 130 and is connectable to an electric vehicle 137 parked outside the building 130. The power source 132 is also connected to a private power generator 136 installed in the building 130 via the power hub 134 and is connectable to an external centralized power system 138 via the smart meter 133 and the power hub 134, for example. The electric device (electronic device) 135 includes one or two or more home appliances, for example. Examples of the home appliances include refrigerator, air-conditioner, television, water heater, and others. The private power generator 136 is formed from a solar power generator, a wind power generator, or the like, for example. Examples of the electric vehicle 137 include electric automobile, hybrid automobile, electric motorcycle, electric bicycle, Segway (registered trademark), and others. Examples of the centralized power system 138 include, but not limited to, commercial power source, power generating equipment, power distribution grid, smart grid (next-generation power distribution grid), heat power plant, nuclear power plant, hydro power plant, and wind power plant. In addition, examples of the power generating equipment in the centralized power system 138 include, but not limited to, various solar cell, fuel cell, wind force power generator, micro hydraulic power generator, geothermal power generator, and others.

The control unit 131 (controller) controls the entire operation of the power storage system (including the usage state of the power source 132), and includes a CPU, a processor and the like, for example. The control unit 131 also includes the secondary battery charging apparatus 10 described above in relation to the first to third examples. The power source 132 includes one or two or more lithium-ion secondary batteries (not illustrated) described above in relation to the first to fourth examples. The smart meter 133 is a network-compatible power meter installed in the building 130 on the power-demanding side, for example, which is communicable with the power-supplying side. The smart meter 133 controls a balance between demand and supply in the building 130 through communications with the outside, for example, to achieve efficient and stable energy supply.

In the power storage system, for example, the power from the centralized power system 138 as an external power source is accumulated in the power source 132 via the smart meter 133 and the power hub 134 and the power from the private power generator 136 as an independent power source is accumulated in the power source 132 via the power hub 134. The power accumulated in the power source 132 is supplied to the electric device (electronic device) 135 and the electric vehicle 137 according to instructions from the control unit 131. This makes it possible to activate the electric device (electronic device) 135 and charge the electric vehicle 137. That is, the power storage system is a system that uses the power source 132 to accumulate and supply power in the building 130.

The power accumulated in the power source 132 can be used arbitrarily. Accordingly, for example, the power from the centralized power system 138 is accumulated in the power source 132 at off-peak energy hours such as late at night so that the power accumulated in the power source 132 can be used during daytime hours when electricity rates are higher.

The power storage system described above may be installed in each home (household) or in plural homes (plural households).

Figure 15C:
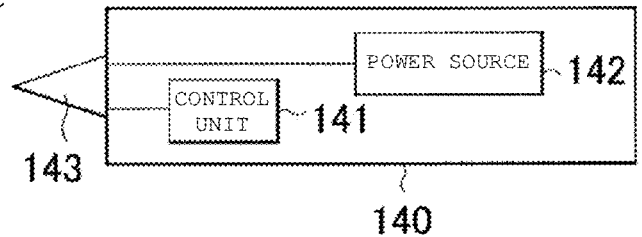
Figure 16B:
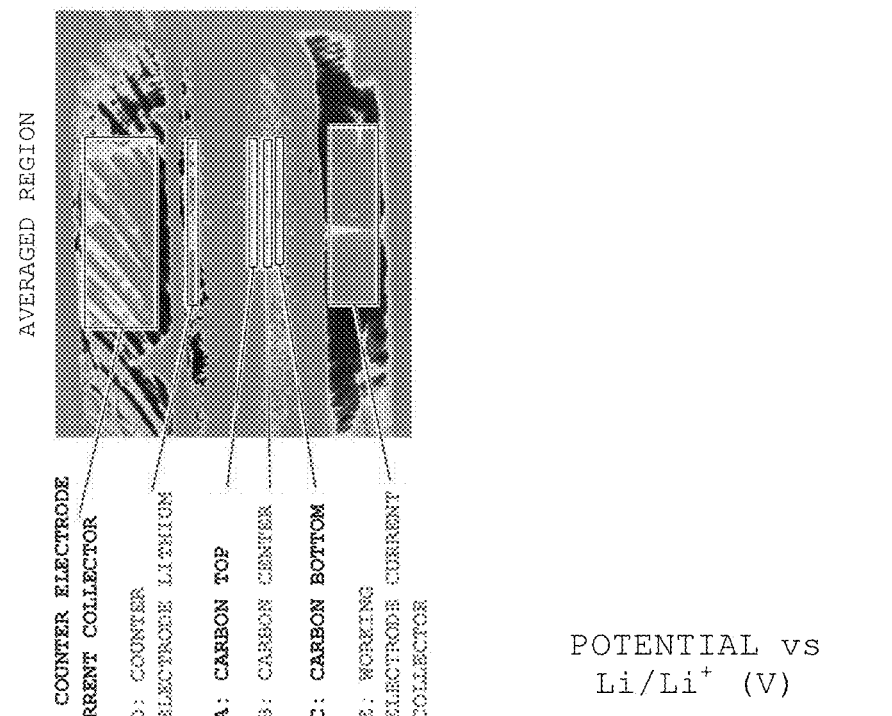
FIGS. 16A and 16B are respectively a diagram illustrating average temperature transition and potential change in each internal region of the secondary battery in a charging and discharging cycle and a diagram illustrating the results of microscopic thermo viewer observation of a test lithium-ion secondary battery for testing in the charging and discharging cycle.
Figure 16A:
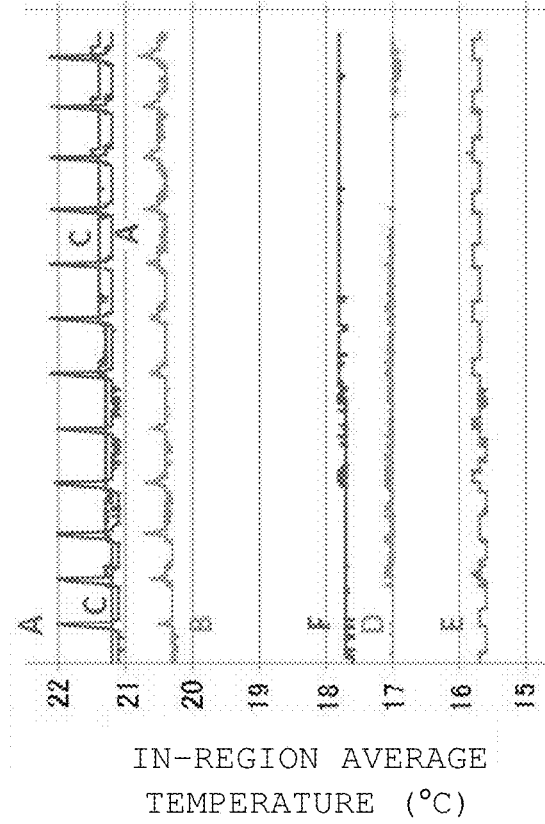
Figure 17:
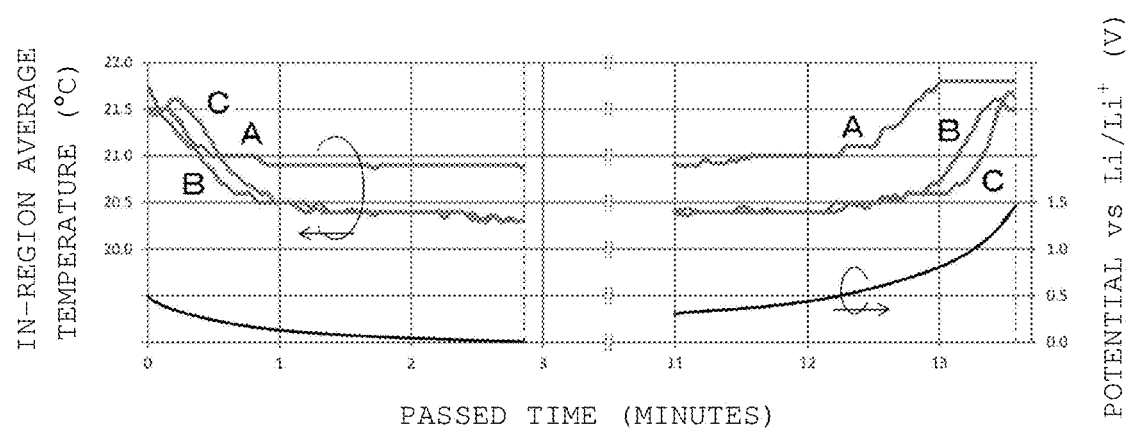
FIG. 17 is a graph indicating the state of temperature drop in the order of a region A, a region B, and a region C of a secondary battery at the start of charging of the secondary battery and a graph indicating the state of temperature rise in the order of the region A, the region B, and the region C of the secondary battery at the start of discharging of the secondary battery.

Next, FIG. 15C is a block diagram of a configuration of an electric tool. The electric tool is an electric drill, for example, which includes a control unit 141 and a power source 142 in a tool body 140 made from a plastic material or the like. The tool body 140 has a drill portion 143 as a movable portion attached thereto in a rotatable manner, for example. The control unit 141 controls the entire operation of the electric tool (including the usage state of the power source 142), and includes a CPU and the like, for example. The control unit 141 also includes the secondary battery charging apparatus 10 described above in relation to the first to third examples. The power source 142 includes one or two or more lithium-ion secondary batteries (not illustrated) described above in relation to the first to fourth examples. The control unit 141 supplies power from the power source 142 to the drill portion 143 according to the operation of an operation switch not illustrated.

The present disclosure has been described so far based on preferred examples. However, the present disclosure is not limited to these examples but can be modified in various manners. The configurations and structures of the secondary battery charging apparatuses, the temperature information acquisition devices, the charging methods of a secondary battery, and the in-situ measurement method of an electrochemical impedance spectrum described above in relation to the examples are mere exemplifications and can be changed as appropriate. The electrode structure may be in a wound state or a stacked state. The secondary battery is not limited to a lithium-ion secondary battery.

The positive-electrode member, the negative-electrode member, and the non-aqueous electrolyte solution constituting the foregoing lithium-ion secondary battery will be described below.

The electrolyte layer 28 contains a non-aqueous electrolyte solution and a holding polymer compound. The non-aqueous electrolyte solution may be held by the holding polymer compound. The electrolyte layer 28 is a gel-like electrolyte that provides a high ionic conductivity (for example, 1 mS/cm or more at ambient temperature) and prevents the leaking of the non-aqueous electrolyte solution. The electrolyte layer 28 may further contain another material such as an additive.

The composition of the non-aqueous electrolyte solution can be as shown in Table 5 below.

TABLE 5

| | |
|---|---|
| Organic solvent: | EC/PC a mass ratio of 1/1 |
| Lithium salt constituting a non-aqueous electrolyte solution: | $LiPF_6$ 1.0 mol/litter |
| Another additive: | vinylene carbonate (VC) 1 mass % |

In the electrolyte layer 28 as a gel-like electrolyte, the solvent of the non-aqueous electrolyte solution indicates a wide-range concept that includes not only liquid materials but also ion-conductive materials capable of dissociating electrolyte salt. Therefore, in the case of using an ion-conductive polymer compound, the polymer compound is also included in the solvent. Instead of the gel-like electrolyte layer 28, the non-aqueous electrolyte solution may be used for what it is. In this case, the electrode structure 21 is impregnated with the non-aqueous electrolyte solution.

Specifically, to form the electrolyte layer 28, the non-aqueous electrolyte solution is first prepared. Then, the non-aqueous electrolyte solution, the holding polymer compound, and the organic solvent (dimethyl carbonate) are mixed to prepare a sol-like precursor solution. The holding polymer compound uses a copolymer of hexafluoropropylene and vinylidene fluoride (the amount of copolymerization of hexafluoropropylene is 6.9 mass %). Then, the precursor solution is applied to the positive-electrode member 22 and the negative-electrode member 24, and the precursor solution is dried to form the gel-like electrolyte layer 28.

The lithium-ion secondary battery including the gel-like electrolyte layer 28 can be produced by any of three types of procedures described below, for example.

In the first procedure, first, the positive-electrode active material layer 22B is formed on the both sides of the positive-electrode current collector 22A, and the negative-electrode active material layer 24B is formed on the both sides of the negative-electrode current collector 24A. Meanwhile, the non-aqueous electrolyte solution, the holding polymer compound, and the organic solvent are mixed to prepare the sol-like precursor solution. Then, the precursor solution is applied to the positive-electrode member 22 and the negative-electrode member 24, and the precursor solution is dried to form the gel-like electrolyte layer 28. After that, the positive-electrode lead portion 23 is attached to the positive-electrode current collector 22A and the negative-electrode lead portion 25 is attached to the negative-electrode current collector 24A by using a welding method or the like. Then, the positive-electrode member 22 and the negative-electrode member 24 are laminated with the separator 26 formed from a 26 μm-thick microporous polypropylene film interposed therebetween, and the laminated members are wound to produce the electrode structure 21, and then the protective tape 29 is attached to the outermost peripheral portion. After that, the exterior member 50 is folded to sandwich the electrode structure 21, and the outer edges of the exterior member 50 are bonded together by using a heat sealing method or the like to enclose the electrode structure 21 in the exterior member 50. An adhesive film 51 (50 μm-thick acid-modified propylene film) is inserted between the positive-electrode lead portion 23 and the negative-electrode lead portion 25, and the exterior member 50.

Otherwise, in the second procedure, first, the positive-electrode member 22 and the negative-electrode member 24 are produced. Then, the positive-electrode lead portion 23 is attached to the positive-electrode member 22 and the negative-electrode lead portion 25 is attached to the negative-electrode member 24. After that, the positive-electrode member 22 and the negative-electrode member 24 are laminated with the separator 26 interposed therebetween, and the laminated members are wound to produce a wound body as precursor body of the electrode structure 21. Then, the protective tape 29 is attached to the outermost peripheral portion of the wound body. Then, the exterior member 50 is folded to sandwich the wound body, and all the outer peripheral edges of the exterior member 50 except one are bonded together by using a heat sealing method or the like to enclose the wound body in the bag-like exterior member 50. Meanwhile, the non-aqueous electrolyte solution, a monomer as a material for a polymer compound, a polymerization initiator, and another material such as a polymerization inhibitor as necessary are mixed to prepare an electrolyte composition. The electrolyte composition is injected into the bag-like exterior member 50, and then the exterior member 50 is sealed by using a heat sealing method or the like. After that, the monomer is thermally polymerized to form a polymer compound. Accordingly, the gel-like electrolyte layer 28 is formed.

Otherwise, in the third procedure, a wound body is produced and stored in the bag-like exterior member 50 in the same manner as in the second procedure except that the separator 26 has a polymer compound applied to the both sides. The polymer compound applied to the separator 26 is a polymer including vinylidene fluoride as a main ingredient (homopolymer, copolymer, or multi-component copolymer), for example. Specifically, examples of the polymer compound include binary copolymers containing polyvinylidene fluoride, vinylidene fluoride, and hexafluoropropylene, and ternary copolymers containing vinylidene fluoride, hexafluoropropylene, and chlorotrifluoroethylene. Together with the polymer containing vinylidene fluoride, another one or more kinds of polymer compounds may be used. After that, a non-aqueous electrolyte solution is prepared and injected into the exterior member 50, and then the opening of the exterior member 50 is sealed by using a heat sealing method or the like. Then, the exterior member 50 is heated with application of a load, and the separator 26 is stuck to the positive-electrode member 22 and the negative-electrode member 24 with the polymer compound therebetween. Accordingly, the polymer compound is impregnated with the non-aqueous electrolyte solution and turned into a gel to form the electrolyte layer 28.

In the third procedure, the bulge of the lithium-ion secondary battery is suppressed as compared to the first procedure. In the third procedure, as compared to the second procedure, the solvent and the monomer as a material for the polymer compound are hardly left in the electrolyte layer 28, which enables favorable control of the formation process of the polymer compound. Accordingly, the positive-electrode member 22, the negative-electrode member 24, the separator 26, and the electrolyte layer 28 are sufficiently bonded.

The positive-electrode member 22 may be produced by the method described below. That is, first, lithium carbonate ($Li_2CO_3$) and cobalt carbonate ($CoCO_3$) are mixed and the mixture is fired in the air (at 900° C. for five hours) to obtain a lithium-containing complex oxide ($LiCoO_2$). In this case, the mixture ratio is set to $Li_2CO_3:CoCO_3=0.5:1$ in mole, for example. Then, 91 pts. mass of a positive-electrode active material ($LiCoO_2$), 3 pts. mass of a positive-electrode binding agent (polyvinylidene fluoride), and 6 pts. mass of a positive-electrode conducting agent (black lead) are mixed to form a positive-electrode mixture. The positive-electrode mixture is mixed with an organic solvent (N-methyl-2-pyrrolidone) into a paste-like positive-electrode mixture slurry. After that, the positive-electrode mixture slurry is applied to the both sides of the belt-like positive-electrode current collector 22A by using a coating device, and the positive-electrode mixture slurry is dried to form the positive-electrode active material layer 22B. The positive-electrode active material layer 22B is compressed and molded by a roll press machine.

In the case of using $Li_{1.15}(Mn_{0.65}Ni_{0.22}Co_{0.13})_{0.85}O_2$ as a positive-electrode active material, first, nickel sulfate ($NiSO_4$), cobalt sulfate ($CoSO_4$), and manganese sulfate ($MnSO_4$) are mixed. The mixture is dispersed in water to prepare a water solution. Then, while the water solution is fully stirred, sodium hydroxide (NaOH) is added to the water solution to obtain a coprecipitate (manganese-nickel-cobalt composite coprecipitated hydroxide). After that, the precipitate is washed by water and lithium hydroxide monohydrate salt is added to the precipitate to obtain a precursor. Then, the precursor is fired in the atmosphere (at 800° C. for 10 hours) to obtain the foregoing positive-electrode active material.

In addition, in the case of using $LiNi_{0.5}Mn_{1.50}O_4$ as a positive-electrode active material, first, lithium carbonate ($Li_2CO_3$), manganese oxide ($MnO_2$), and nickel oxide (NiO) are weighed and the weighed substances are mixed in a ball mill. In this case, the mixture ratio of the main elements (in mole) is set to Ni:Mn=25:75. Next, the mixture is burned in the atmosphere (at 800° C. for 10 hours) and then cooled. Then, the burned substances are mixed again in a ball mill, and are burned again in the atmosphere (at 700° C. for 10 hours) to obtain the foregoing positive-electrode active material.

The negative-electrode member 24 can also be produced by the method described below. That is, first, 97 pts. mass of a negative-electrode active material (black lead or graphite) and 3 pts. mass of a negative-electrode binding agent (polyvinylidene fluoride) are mixed to form a negative-electrode mixture. The average grain diameter $d_{50}$ of the black lead is 20 μm. As a negative-electrode binding agent, for example, a mixture of 1.5 pts. mass of an acrylic-modified product of styrene-butadiene copolymer and 1.5 pts. mass of carboxymethyl cellulose is used. Then, the negative-electrode mixture is mixed with water to form a paste-like negative-electrode mixture slurry. After that, the negative-electrode mixture slurry is applied to the both sides of the belt-like negative-electrode current collector 24A by using a coating device, and the negative-electrode mixture slurry is dried to form the negative-electrode active material layer 24B. The negative-electrode active material layer 24B is compressed and molded by a roll press machine.

Otherwise, a negative-electrode active material (silicon) and a precursor of a negative-electrode binding agent (polyamic acid) may be mixed to form a negative-electrode mixture. In this case, the mixture ratio is set to silicon:polyamic acid=80:20 in dry mass. Average grain diameter $d_{50}$ of silicon is set to 1 μm. As solvents for the polyamic acid, N-methyl-2-pyrrolidone and N, N-dimethylacetamide are used. In addition, after the compressive molding, the negative-electrode mixture slurry is heated in the vacuum atmosphere at 100° C. for 12 hours. Accordingly, polyimide is formed as a negative-electrode binding agent.

Specific examples of the binding agents in the positive-electrode member and the negative-electrode member include synthetic rubbers such as styrene-butadiene rubber, fluorine rubber, and ethylene-propylene-diene, and polymer materials such as fluorine-based resins like polyvinylidene fluoride, polyvinyl fluoride, polyimide, and polytetrafluoroethylene. Examples of the conducting agents in the positive-electrode member and the negative-electrode member include carbon materials such as black lead, carbon black, graphite, acetylene black, and Ketchen black. However, the conducting agents may be metallic materials, conductive polymers, or the like as far as they are electrically conductive.

Examples of the material for the negative-electrode active material layer include carbon materials. Carbon materials have very few changes in crystal structure at the time of occlusion and emission of lithium, which makes it possible to obtain a high energy density in a stable manner. Carbon materials also act as a negative-electrode conducting agent to improve the conductivity of the negative-electrode active material layer. Examples of carbon materials include graphitizable carbon (soft carbon), non-graphitizable carbon (hard carbon), black lead (graphite), and high-crystalline carbon materials with a crystal structure developed. However, the surface spacing between (002) surfaces in the non-graphitizable carbon is preferably 0.37 nm or more, and the surface spacing between (002) surfaces in the black lead is preferably 0.34 nm or less. More specifically, examples of carbon materials include pyrolytic carbons, cokes such as pitch cokes, needle cokes, petroleum cokes, black carbons, glass-like carbon fibers, organic polymer compound fired bodies obtained by burning (carbonizing) a polymer compound such as phenol resin or furan resin at an appropriate temperature, carbon fibers, activated carbons, carbon blacks, and polymers such as polyacetylene. The carbon material may be a low-crystalline carbon thermally processed at a temperature of about 1000° C. or less and amorphous carbon. The shape of the carbon material may be any of fiber, ball, grain, and scale.

Examples of the material for the negative-electrode active material layer include a material including one or more kinds of metal elements or semi-metal elements as constituent element (hereinafter, called "metallic material"), which makes it possible to obtain a high energy density. The metallic material may be a single substance, an alloy, or a compound, or may be formed from two or more of them, or may have at least partially one or more kinds of phases. The alloy may be a material formed from two or more kinds of metallic elements or a material including one or more kinds of metallic elements and one or more kinds of semi-metallic elements. The alloy may include a non-metallic element. Examples of constitution of the metallic material include a solid solution, a eutectic (eutectic mixture), an intermetallic compound, and coexisting substances of two or more kinds of them.

Examples of the metallic element and the semi-metallic element include metallic elements and semi-metallic elements capable of forming a lithium and an alloy. Specific examples include magnesium (Mg), boron (B), aluminum (Al), gallium (Ga), indium (In), silicon (Si), germanium (Ge), tin (Sn), lead (Pb), antimony (Sb), bismuth (Bi), cadmium (Cd), silver (Ag), zinc (Zn), hafnium (Hf), zirconium (Zr), yttrium (Y), palladium (Pd), and platinum (Pt). Among them, silicon (Si) and tin (Sn) are preferable for their excellent ability of occluding and emitting lithium to provide a significantly high energy density.

The material including silicon as a constituent element may be a silicon single substance, a silicon alloy, or a silicon compound, or may be a material formed from two or more kinds of them, or may be a material having at least partially the one or two or more kinds of phases. The material including tin as a constituent element may be a tin single substance, a tin alloy, or a tin compound, or may be a material formed from two or more kinds of them, or may be a material having at least partially the one or two or more kinds of phases. The single substance means a general level of single substance that does not necessarily have a 100% purity but may include trace amounts of impurities.

Besides, examples of a material constituting the negative-electrode active material layer include metallic oxides such as iron oxide, ruthenium oxide, and molybdenum oxide, and polymer compounds such as polyacetylene, polyaniline, and polypyrrole.

Among them, the materials for the negative-electrode active material layer preferably include both a carbon material and a metallic material for the reason described below. That is, a metallic material, in particular, a material containing at least silicon or tin as a constituent element has an advantage of a high theoretical capacity but is likely to significantly expand and contract at the time of charging and discharging. On the other hand, a carbon material has a low theoretical capacity but is unlikely to expand and contract at the time of charging and discharging. Accordingly, using both a carbon material and a metallic material makes it possible to suppress the expansion and contraction at the time of charging and discharging while obtaining a high theoretical capacity (in other words, battery capacity).

The present technology is described below in further detail according to an embodiment.

[A01]

A secondary battery charging apparatus including: a charge control device that controls charge current for charging a secondary battery; and a temperature information acquisition device that acquires an internal temperature of the secondary battery, wherein, during the charging of the secondary battery, the temperature information acquisition device collects plural pieces of charge current data and charge voltage data in time series and acquires the internal temperature of the secondary battery based on the collected plural pieces of charge current data and charge voltage data, and the charge control device charges the secondary battery while controlling the charge current for charging the secondary battery such that the internal temperature of the secondary battery acquired by the temperature information acquisition device falls within a predetermined temperature range.

[A02] The secondary battery charging apparatus according to [A01], wherein, during the charging of the secondary battery, the temperature information acquisition device

41 determines M data sets in first to M-th degrees each of which includes (2N+1) charge current data consecutive in time series and (2N+1) charge voltage data consecutive in time series in an m-th degree, where N is a positive integer and m=1, 2, 3, . . . M, at a p-th unit time $t_p$ represented by Equation (A) below, where a time of length T/(M×$2^M$) obtained by dividing a predetermined time T into (N×$2^M$) is a unit time t:

$$p = N \times 2^{M-1} + (-N+n) \times 2^{m-1} \tag{A}$$

where n=0, 1, 2 . . . 2N.

[A03] The secondary battery charging apparatus according to [A02], wherein an electrochemical impedance spectrum of the secondary battery is acquired based on the M data sets.

[A04] The secondary battery charging apparatus according to any one of [A01] to [A03], wherein the temperature information acquisition device subjects the collected plural pieces of charge current data and charge voltage data to Fourier transform or Wavelet transform, determines an internal resistance value of the secondary battery based on transform results, and acquires the internal temperature of the secondary battery from the internal resistance value.

[B01]

A secondary battery charging apparatus including: a charge control device that controls charge current for charging a secondary battery having a positive-electrode member, a negative-electrode member, a separator, and an electrolyte, the positive-electrode member, the separator, and the negative-electrode member forming a wound electrode structure, and having a first lead portion and a second lead portion attached to one end and the other end of any one of the positive-electrode member and the negative-electrode member constituting the wound electrode structure; and a temperature information acquisition device that acquires an internal temperature of the secondary battery, wherein, during the charging of the secondary battery, the temperature information acquisition device determines an internal resistance value of the secondary battery from an alternating-current impedance measurement value determined by flowing alternating current between the first lead portion and the second lead portion and acquires the internal temperature of the secondary battery from the internal resistance value, and the charge control device charges the secondary battery while controlling the charge current for charging the secondary battery such that the internal temperature of the secondary battery acquired by the temperature information acquisition device falls within a predetermined temperature range.

[C01]

A temperature information acquisition device that acquires an internal temperature of a secondary battery, wherein, during the charging of the secondary battery, the temperature information acquisition device collects plural pieces of charge current data and charge voltage data in time series and acquires the internal temperature of the secondary battery based on the collected plural pieces of charge current data and charge voltage data.

[C02] The temperature information acquisition device according to [C01], wherein, during the charging of the secondary battery, the temperature information acquisition device determines M data sets in first to M-th degrees each of which includes (2N+1) charge current data consecutive in time series and (2N+1) charge voltage data consecutive in time series in an m-th degree, where N is a positive integer and m=1, 2, 3, . . . M, at a p-th unit time $t_p$ represented by

42

Equation (A) below, where a time of length T/(M×$2^M$) obtained by dividing a predetermined time T into (N×$2^M$) is a unit time t:

$$p = N \times 2^{M-1} + (-N+n) \times 2^{m-1} \tag{A}$$

where n=0, 1, 2 . . . 2N.

[C03] The temperature information acquisition device according to [C02], wherein an electrochemical impedance spectrum of the secondary battery is acquired based on the M data sets.

[C04] The temperature information acquisition device according to any one of [C01] to [C03], wherein the temperature information acquisition device subjects the collected plural pieces of charge current data and charge voltage data to Fourier transform or Wavelet transform, determines an internal resistance value of the secondary battery based on transform results, and acquires the internal temperature of the secondary battery from the internal resistance value.

[D01]

A temperature information acquisition device that acquires an internal temperature of a secondary battery having a positive-electrode member, a negative-electrode member, a separator, and an electrolyte, the positive-electrode member, the separator, and the negative-electrode member forming a wound electrode structure, and having a first lead portion and a second lead portion attached to one end and the other end of any one of the positive-electrode member and the negative-electrode member constituting the wound electrode structure, wherein, during the charging of the secondary battery, the temperature information acquisition device determines an internal resistance value of the secondary battery from an alternating-current impedance measurement value determined by flowing alternating current between the first lead portion and the second lead portion and acquires the internal temperature of the secondary battery from the internal resistance value.

[E01]

A charging method of a secondary battery including: during the charging of the secondary battery, collecting plural pieces of charge current data and charge voltage data in time series; acquiring an internal temperature of the secondary battery based on the collected plural pieces of charge current data and charge voltage data; and charging the secondary battery while controlling charge current such that the acquired internal temperature of the secondary battery falls within a predetermined temperature range.

[E02] The charging method of a secondary battery according to [E01], including: during the charging of the secondary battery, determining M data sets in first to M-th degrees each of which includes (2N+1) charge current data consecutive in time series and (2N+1) charge voltage data consecutive in time series in an m-th degree, where N is a positive integer and m=1, 2, 3, . . . M, at a p-th unit time $t_p$ represented by Equation (A) below, where a time of length T/(M×$2^M$) obtained by dividing a predetermined time T into (N×$2^M$) is a unit time t:

$$p = N \times 2^{M-1} + (-N+n) \times 2^{m-1} \tag{A}$$

where n=0, 1, 2 . . . 2N.

[E03] The charging method of a secondary battery according to [E02], including acquiring an electrochemical impedance spectrum of the secondary battery based on the M data sets.

[E04] The charging method of a secondary battery according to any one of [E01] to [E03], including: subjecting the collected plural pieces of charge current data and charge voltage data to Fourier transform or Wavelet transform;

determining an internal resistance value of the secondary battery based on transform results; and acquiring the internal temperature of the secondary battery from the internal resistance value.

[E05] The charging method of a secondary battery according to any one of [E01] to [E04], including: measuring the surface temperature of the secondary battery; estimating the internal temperature of the secondary battery from measurement result of the surface temperature; and when the difference between the estimated internal temperature of the secondary battery and acquired internal temperature of the secondary battery exceeds a predetermined temperature difference, providing a notification of the fact.

[F01]

A charging method of a secondary battery having a positive-electrode member, a negative-electrode member, a separator, and an electrolyte, the positive-electrode member, the separator, and the negative-electrode member forming a wound electrode structure, and having a first lead portion and a second lead portion attached to one end and the other end of any one of the positive-electrode member and the negative-electrode member constituting the wound electrode structure, wherein the charging method includes: during the charging of the secondary battery, determining an internal resistance value of the secondary battery from an alternating-current impedance measurement value determined by flowing alternating current between the first lead portion and the second lead portion; acquiring the internal temperature of the secondary battery from the internal resistance value; and charging the secondary battery while controlling charge current for charging the secondary battery such that the acquired internal temperature of the secondary battery falls within a predetermined temperature range.

[F02] The charging method of a secondary battery according to [F01], including: measuring the surface temperature of the secondary battery; estimating the internal temperature of the secondary battery from measurement result of the surface temperature; and when the difference between the estimated internal temperature of the secondary battery and acquired internal temperature of the secondary battery exceeds a predetermined temperature difference ΔTp, providing a notification of the fact.

[G01]

An in-situ measurement method of an electrochemical impedance spectrum including: during the charging of a secondary battery, collecting M data sets in first to M-th degrees each of which includes (2N+1) charge current data consecutive in time series and (2N+1) charge voltage data consecutive in time series, where N is a positive integer; and acquiring an electrochemical impedance spectrum of the secondary battery based on the M data sets, wherein (2N+1) charge current data and (2N+1) charge voltage data in an m-th degree, where m=1, 2, 3, . . . M, are determined at a p-th unit time $t_p$ represented by Equation (A) below, where a time of length $T/(M \times 2^M)$ obtained by dividing a predetermined time T into $(N \times 2^M)$ is a unit time t:

$$p = N \times 2^{M-1} + (-N+n) \times 2^{m-1} \quad (A)$$

where n=0, 1, 2 . . . 2N.

[H01]

A battery pack including: a control unit that performs a control related to a secondary battery; and an exterior member that encloses the secondary battery, wherein the control unit includes the secondary battery according to any one of [A01] to [B01].

[H02]

An electric vehicle including: a conversion device that receives supply of power from a secondary battery and converts into driving force of the vehicle; and a control device that performs information processing relating to a vehicle control based on information related to the secondary battery, wherein the control device includes the secondary battery charging apparatus according to any one of [A01] to [B01].

[H03]

A power storage system including: a secondary battery; and the secondary battery charging apparatus according to any one of [A01] to [B01].

[H04]

An electric tool including: a secondary battery; a movable portion that is supplied with power from the secondary battery; and the secondary battery charging apparatus according to any one of [A01] to [B01].

[H05]

An electronic device including: a secondary battery; and the secondary battery charging apparatus according to any one of [A01] to [B01].

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A secondary battery charging apparatus comprising:
a charge control device configured to control charge current for charging a secondary battery; and
a temperature information acquisition device configured to acquire an internal temperature of the secondary battery, wherein
the temperature information acquisition device collects charge current data and charge voltage data in time series and acquires the internal temperature of the secondary battery based on the collected charge current data and charge voltage data when the secondary is charging, and
the charge control device is configured to charge the secondary battery and control the charge current for charging the secondary battery to set the internal temperature of the secondary battery within a predetermined temperature range;
wherein, during the charging of the secondary battery, the temperature information acquisition device determines M data sets in first to M-th degrees each of which includes (2N+1) charge current data consecutive in time series and (2N+1) charge voltage data consecutive in time series in an m-th degree, where N is a positive integer and m=1, 2, 3, . . . M, at a p-th unit time $t_p$ represented by Equation (A) below, where a time of length $T/(M \times 2^M)$ obtained by dividing a predetermined time T into $(N \times 2^M)$ is a unit time t:

$$p = N \times 2^{M-1} + (-N+n) \times 2^{m-1} \quad (A)$$

where n=0, 1, 2 . . . 2N.

2. The secondary battery charging apparatus according to claim 1, wherein an electrochemical impedance spectrum of the secondary battery is acquired based on the M data sets.

3. The secondary battery charging apparatus according to claim 1, wherein the temperature information acquisition device is configured to subject the collected charge current data and charge voltage data to Fourier transform or Wavelet transform, determine an internal resistance value of the secondary battery based on transform results, and acquire the internal temperature of the secondary battery from the internal resistance value.

4. A temperature information acquisition device, comprising:
- a processor configured to acquire an internal temperature of a secondary battery,
- wherein the temperature information acquisition device collects charge current data and charge voltage data in time series and acquires the internal temperature of the secondary battery based on the collected charge current data and charge voltage data when the secondary battery is charging
- wherein, during the charging of the secondary battery, the temperature information acquisition device determines M data sets in first to M-th degrees each of which includes (2N+1) charge current data consecutive in time series and (2N+1) charge voltage data consecutive in time series in an m-th degree, where N is a positive integer and m=1, 2, 3, . . . M, at a p-th unit time $t_p$ represented by Equation (A) below, where a time of length $T/(M \times 2^M)$ obtained by dividing a predetermined time T into $(N \times 2^M)$ is a unit time t:

$$p = N \times 2^{M-1} + (-N+n) \times 2^{m-1} \tag{A}$$

where n=0, 1, 2 . . . 2N.

5. The temperature information acquisition device according to claim 4, wherein an electrochemical impedance spectrum of the secondary battery is acquired based on the M data sets.

6. The temperature information acquisition device according to claim 4, wherein the temperature information acquisition device is configured to subject the collected charge current data and charge voltage data to Fourier transform or Wavelet transform, determine an internal resistance value of the secondary battery based on transform results, and acquire the internal temperature of the secondary battery from the internal resistance value.

7. A charging method of a secondary battery comprising:
- collecting charge current data and charge voltage data in time series when the secondary battery is charging;
- acquiring an internal temperature of the secondary battery based on the collected charge current data and charge voltage data; and
- charging the secondary battery while controlling charge current to set the acquired internal temperature of the secondary battery within a predetermined temperature range;
- during the charging of the secondary battery, determining M data sets in first to M-th degrees each of which includes (2N+1) charge current data consecutive in time series and (2N+1) charge voltage data consecutive in time series in an m-th degree, where N is a positive integer and m=1, 2, 3, . . . M, at a p-th unit time $t_p$ represented by Equation (A) below, where a time of length $T/(M \times 2^M)$ obtained by dividing a predetermined time T into $(N \times 2^M)$ is a unit time t:

$$p = N \times 2^{M-1} + (-N+n) \times 2^{m-1} \tag{A}$$

where n=0, 1, 2 . . . 2N.

8. The charging method of a secondary battery according to claim 7, comprising acquiring an electrochemical impedance spectrum of the secondary battery based on the M data sets.

9. The charging method of a secondary battery according to claim 7, comprising:
- subjecting the collected charge current data and charge voltage data to Fourier transform or Wavelet transform;
- determining an internal resistance value of the secondary battery based on transform results; and
- acquiring the internal temperature of the secondary battery from the internal resistance value.

10. The charging method of a secondary battery according to claim 7, comprising:
- measuring a surface temperature of the secondary battery;
- estimating the internal temperature of the secondary battery from a measurement result of the surface temperature; and
- when a difference between the estimated internal temperature of the secondary battery and acquired internal temperature of the secondary battery exceeds a predetermined temperature difference, providing a notification.

\* \* \* \* \*